(12) United States Patent
Nishiwaki et al.

(10) Patent No.: US 10,564,371 B2
(45) Date of Patent: Feb. 18, 2020

(54) WAVEGUIDE SHEET AND PHOTOELECTRIC CONVERSION DEVICE

(71) Applicant: Panasonic Intellectual Property Management Co., Ltd., Osaka (JP)

(72) Inventors: Seiji Nishiwaki, Hyogo (JP); Tohru Nakagawa, Shiga (JP); Tsuyoshi Yamamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/437,494

(22) Filed: Jun. 11, 2019

(65) Prior Publication Data

US 2019/0293880 A1    Sep. 26, 2019

Related U.S. Application Data

(63) Continuation of application No. PCT/JP2017/024620, filed on Jul. 5, 2017.

(30) Foreign Application Priority Data

Dec. 15, 2016  (JP) ................................. 2016-243648

(51) Int. Cl.
*G02B 6/42* (2006.01)
*H01L 31/054* (2014.01)
(Continued)

(52) U.S. Cl.
CPC ........... *G02B 6/4215* (2013.01); *G02B 6/124* (2013.01); *G02B 6/125* (2013.01); *G02B 6/13* (2013.01); *G02B 6/26* (2013.01); *G02B 6/34* (2013.01); *G02B 6/42* (2013.01); *G02B 6/4298* (2013.01); *G02B 19/0009* (2013.01);
(Continued)

(58) Field of Classification Search
CPC ....................................................... G02B 6/42
See application file for complete search history.

(56) References Cited

U.S. PATENT DOCUMENTS

2013/0264470 A1    10/2013    Nishiwaki

FOREIGN PATENT DOCUMENTS

| JP | 61-156231 | 7/1986 |
| JP | 62-11833 | 1/1987 |
| WO | 2012/046414 | 4/2012 |

*Primary Examiner* — Marvin Payen
(74) *Attorney, Agent, or Firm* — Wenderoth, Lind & Ponack, L.L.P.

(57) ABSTRACT

A waveguide sheet captures incident light and waveguides the incident light in a direction intersecting with an incident direction. The waveguide sheet includes a diffraction grating layer that changes a traveling direction of the incident light and a plurality of first light-transmissive pairs. Each of the first light-transmissive pairs includes a first light-transmissive layer having a shape with first concave streaks and first convex streaks being repeatedly arranged in a first direction that is a direction intersecting with the incident direction, and a second light-transmissive layer laminated on the first light-transmissive layer. In the plurality of first light-transmissive pairs, the first light-transmissive layer is located closer to a side of the diffraction grating layer and each of the first concave streaks of another first light-transmissive layer is located between adjacent first convex streaks among the first convex streaks of the first light-transmissive layer as seen in the incident direction.

20 Claims, 17 Drawing Sheets

(51) Int. Cl.
*G02B 19/00* (2006.01)
*H02S 40/22* (2014.01)
*G02B 6/125* (2006.01)
*G02B 6/124* (2006.01)
*G02B 6/26* (2006.01)
*G02B 6/13* (2006.01)
*G02B 6/34* (2006.01)

(52) U.S. Cl.
CPC ........ *G02B 19/0042* (2013.01); *H01L 31/054* (2014.12); *H02S 40/22* (2014.12); *Y02E 10/52* (2013.01)

WAVEGUIDE SHEET AND PHOTOELECTRIC CONVERSION DEVICE

BACKGROUND

1. Technical Field

The present disclosure relates to a waveguide sheet that captures light by using diffraction and a photoelectric conversion device using the waveguide sheet.

2. Description of the Related

Patent literature 1 discloses a waveguide sheet that captures light by using diffraction of light. The waveguide sheet disclosed in Patent Literature 1 includes a light-transmissive sheet and a light coupling structure in the light-transmissive sheet. The light coupling structure includes a first light-transmissive layer, a second light-transmissive layer, and a third light-transmissive layer sandwiched between them. The refractive index of the first and second light-transmissive layers is lower than the refractive index of the light-transmissive sheet, and the refractive index of the third light-transmissive layer is higher than the refractive index of the first and second light-transmissive layers. The third light-transmissive layer has a diffraction grating. This makes it possible to capture light in a wide wavelength range at a wide incident angle.

Patent Literature 1 is International Publication No. 2012/046414.

SUMMARY

The present disclosure provides a waveguide sheet that captures incident light and guides the incident light in a direction intersecting with an incident direction of the light. This waveguide sheet is configured to easily internally hold light captured inside the waveguide sheet. The present disclosure also provides a photoelectric conversion device using the waveguide sheet.

A waveguide sheet according to the present disclosure captures incident light and waveguides the incident light in a direction intersecting with an incident direction of the incident light. The waveguide sheet includes a diffraction grating layer that changes a traveling direction of the incident light and a plurality of first light-transmissive pairs. Each of the first light-transmissive pairs includes a first light-transmissive layer having a shape with first concave streaks and first convex streaks being repeatedly arranged in a first direction that is a direction intersecting with the incident direction and a second light-transmissive layer laminated on the first light-transmissive layer. In the plurality of first light-transmissive pairs, the first light-transmissive layer is located closer to a side of the diffraction grating layer than the second light-transmissive layer and each of the first concave streaks of another first light-transmissive layer is located between adjacent first convex streaks among the first convex streaks of the first light-transmissive layer as seen in the incident direction.

A photoelectric conversion device according to the present disclosure includes the above waveguide sheet, and a photoelectric conversion element that has a light-receiving surface that receives light and converts the light received by the light-receiving surface into power. The photoelectric conversion element is disposed around the waveguide sheet, the light-receiving surface being located to face an end face of the waveguide sheet located in a direction intersecting with the incident direction.

The waveguide sheet according to the present disclosure is configured to easily internally hold light captured inside the waveguide sheet.

The photoelectric conversion device according to the present disclosure can capture incident light from outside through a wide area by using the waveguide sheet and efficiently guide the captured incident light to the photoelectric conversion element disposed at the end face side of the waveguide sheet. Accordingly, the device can efficiently photoelectrically convert the incident light.

BRIEF DESCRIPTION OF DRAWINGS

Part (a) of FIG. 1 is a perspective view showing a photoelectric conversion device according to the present disclosure. Part (b) of FIG. 1 is a sectional view showing a section of the photoelectric conversion device shown in part (a) of FIG. 1 taken along Ib-Ib.

Figure 3:
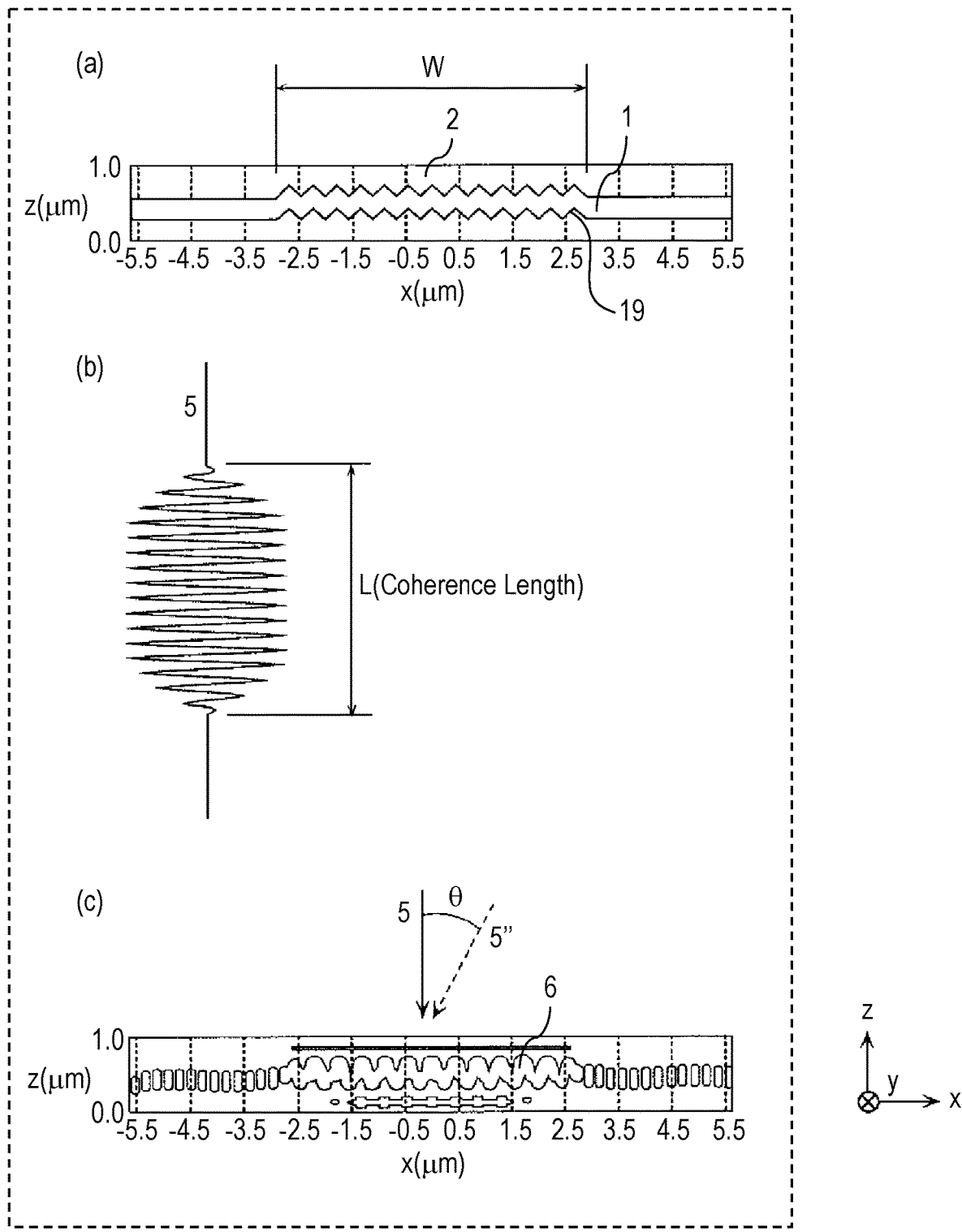

Part (a) of FIG. 3 is a schematic sectional view showing a diffraction grating layer according to the first exemplary embodiment. Part (b) of FIG. 3 is an explanatory view for explaining a coherence length of incident light on the diffraction grating layer. Part (c) of FIG. 3 is an explanatory view showing how light is input to the diffraction grating layer shown in part (a) of FIG. 3 and the input light propagates in a diffraction grating.

Figure 4:
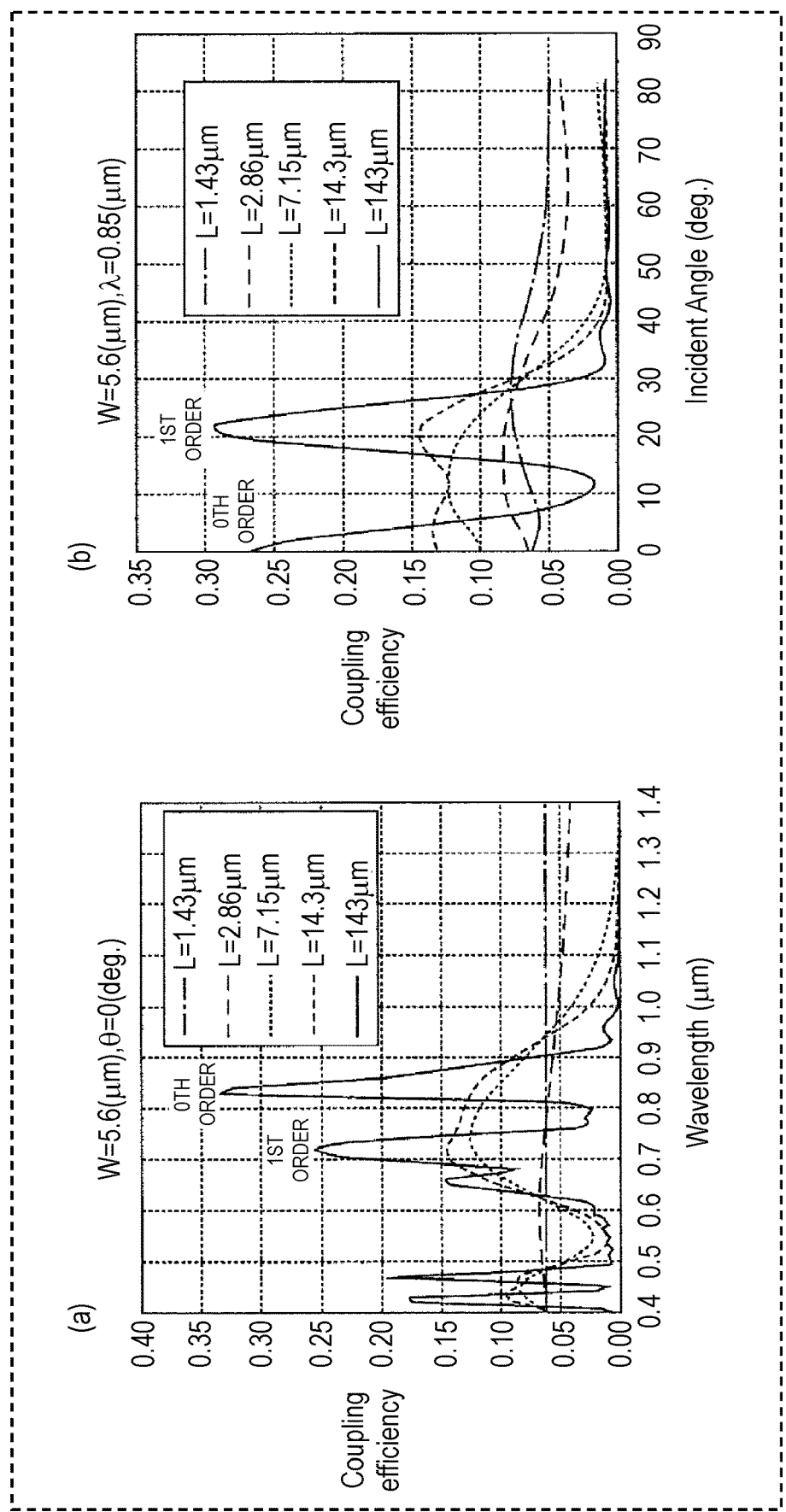

Part (a) of FIG. 4 is an explanatory graph showing wavelength dependence of light input efficiency of the diffraction grating layer shown in FIG. 3. Part (b) of FIG. 4 is an explanatory graph showing angle dependence of light input efficiency of the diffraction grating layer shown in FIG. 3.

Figure 5:
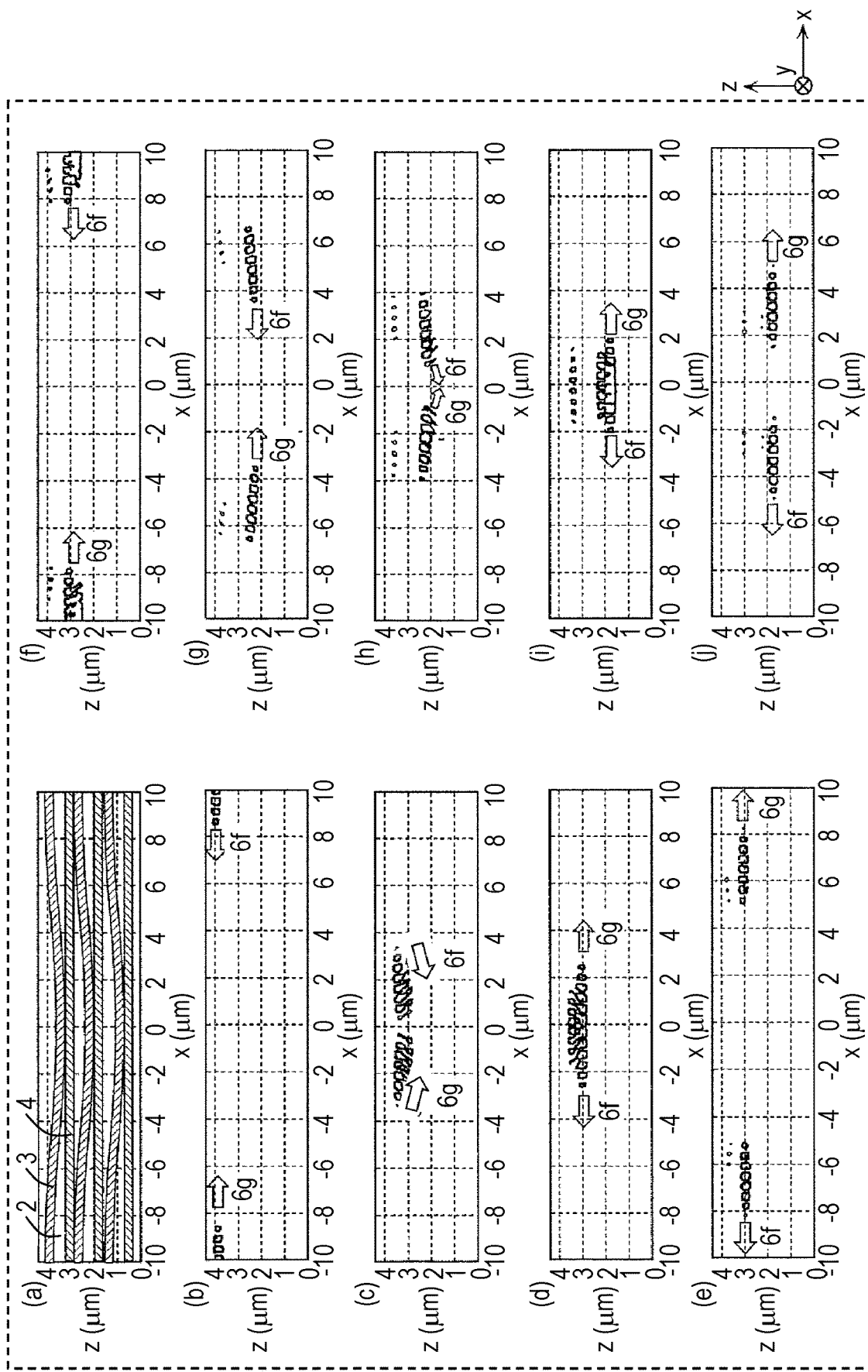

Part (a) of FIG. 5 is a sectional view of a laminated body of parallel layers and meandering layers according to the first exemplary embodiment, and parts (b) to (j) of FIG. 5 are time-series explanatory charts of intensity distributions of waveguided light sequentially shifting and propagating through the meandering layers and parallel layers in correspondence with the sectional view of part (a) of FIG. 5.

Figure 6:
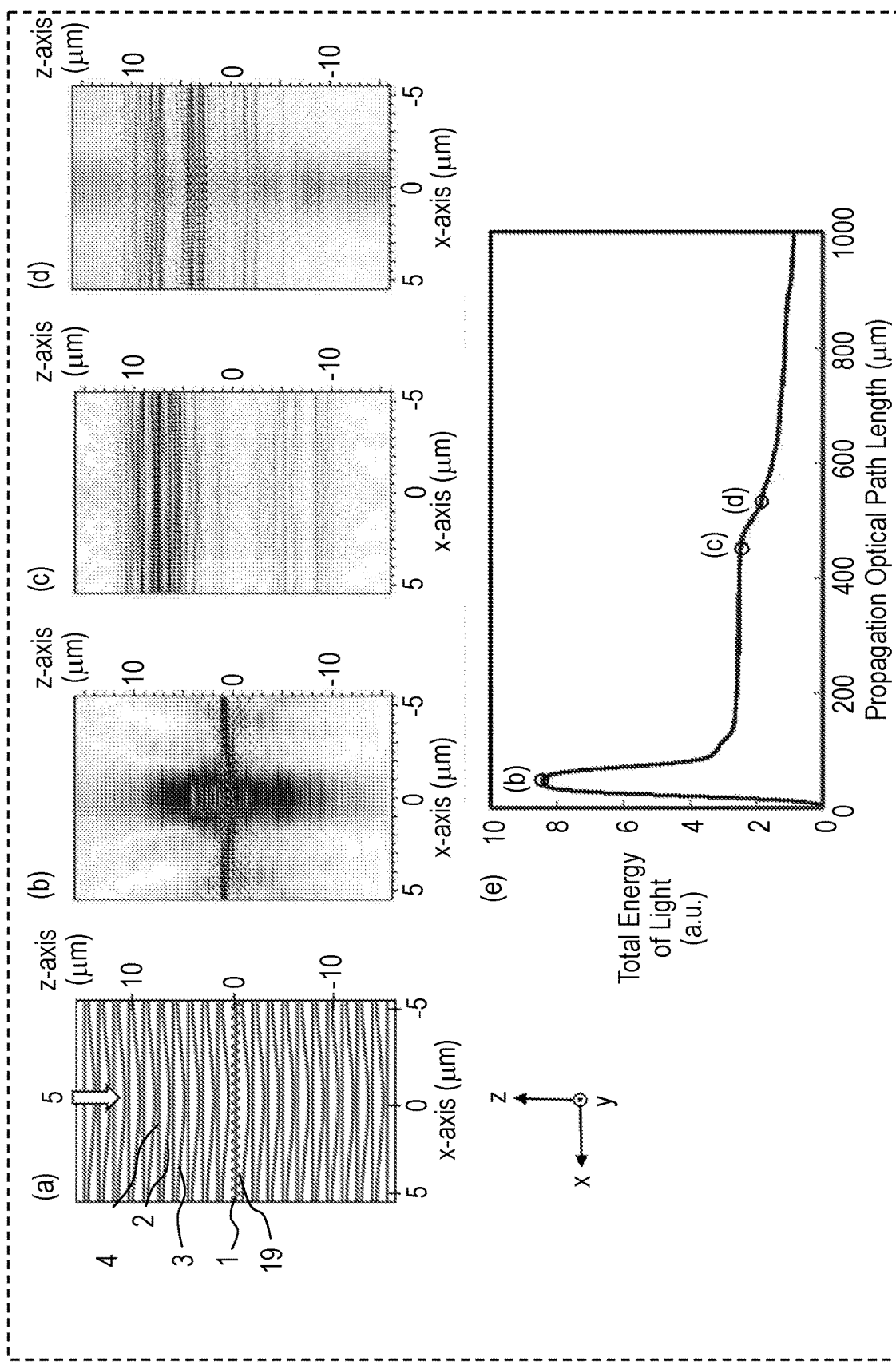

Part (a) of FIG. 6 is a sectional view of the laminated body of the parallel layers and meandering layers including the diffraction grating layer according to the first exemplary embodiment. Parts (b) to (d) of FIG. 6 are time-series explanatory charts of simulation results on the intensity distributions of the waveguided light sequentially shifting and propagating through the parallel layers and meandering layers after being input to the diffraction grating layer in correspondence with the sectional view of part (a) of FIG. 6. Part (e) of FIG. 6 is an explanatory graph showing a simulation result on total energy of light in an analysis region with respect to a propagation optical path length of waveguided light propagating in the laminated body.

Figure 7:
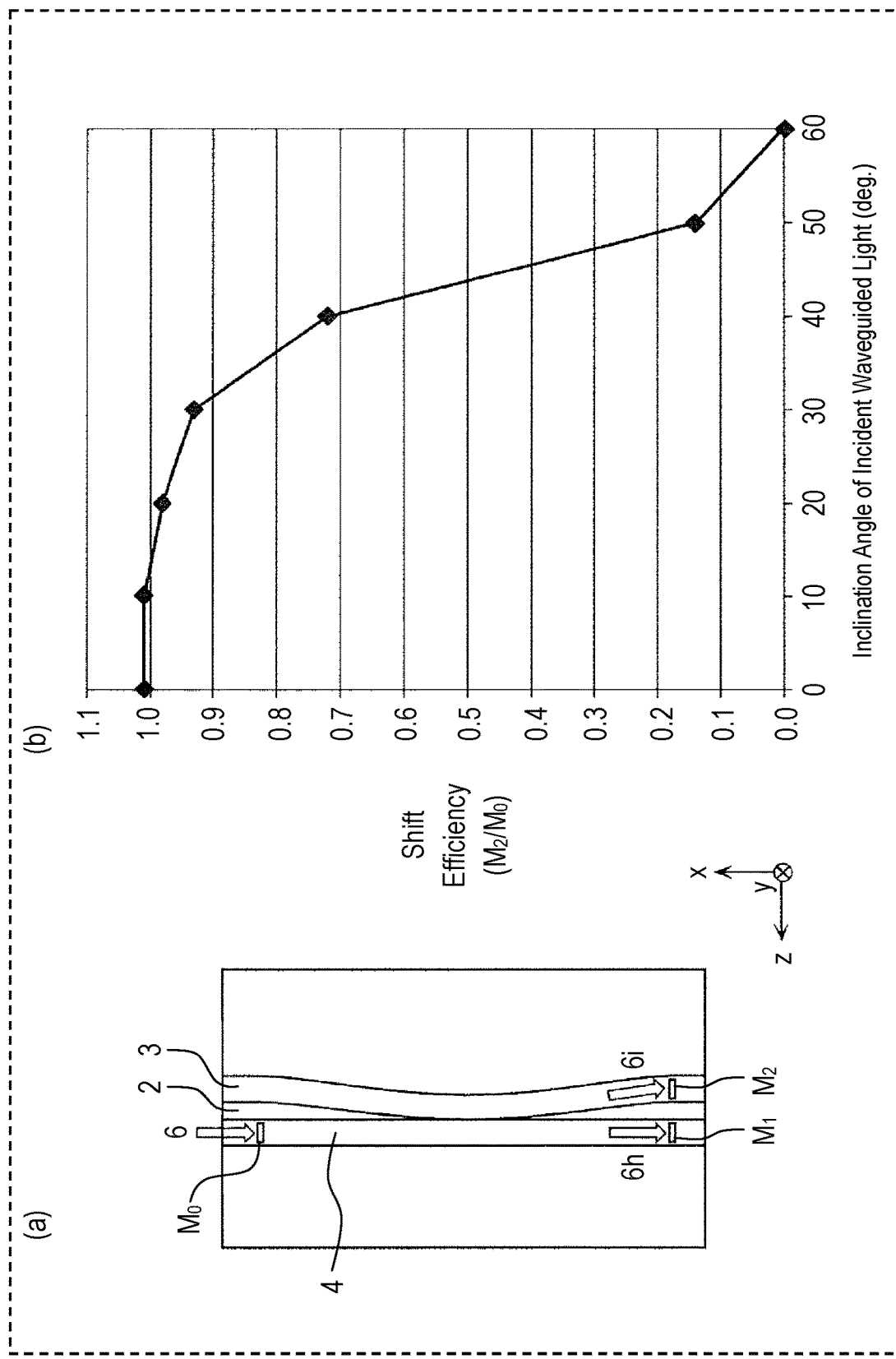

FIG. 7 is an explanatory view showing a simulation result on a change in inclination of a propagating direction of waveguided light and a change in shift efficiency of light.

Figure 8:
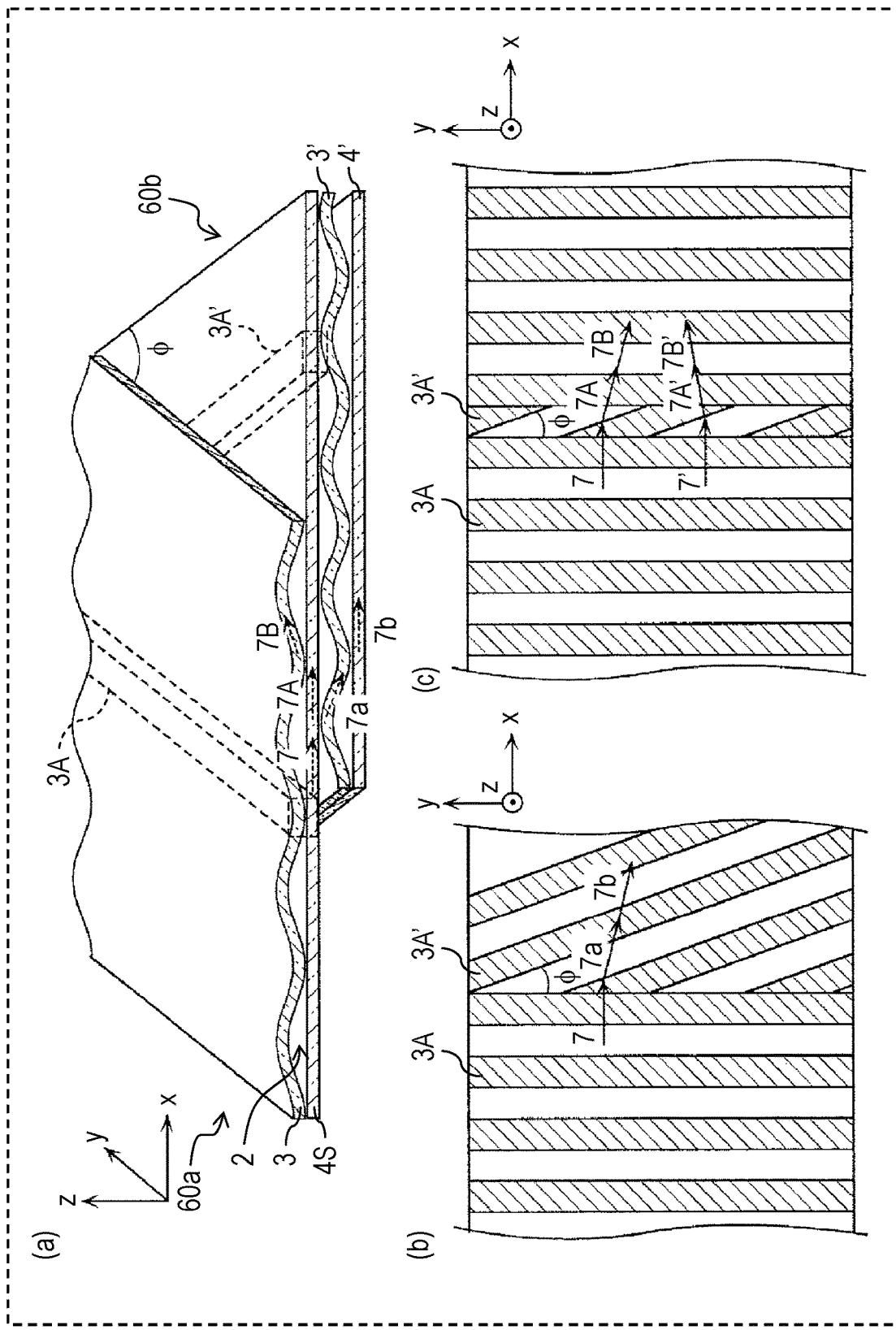

Part (a) of FIG. 8 is an explanatory view showing how waveguided light propagates when a parallel layer of the waveguide sheet according to the first exemplary embodiment is sandwiched between meandering layers having different meandering directions. Part (b) of FIG. 8 is an explanatory view showing a simulation result on a shift phenomenon of light propagating from a parallel layer to a meandering layer located on a lower surface side of the parallel layer by using a two-dimensional model. Part (c) of FIG. 8 is an explanatory view showing a simulation result on a shift phenomenon of light that has not propagated from a parallel layer to a meandering layer located on a lower surface of the parallel layer by using a two-dimensional model.

Figure 9:
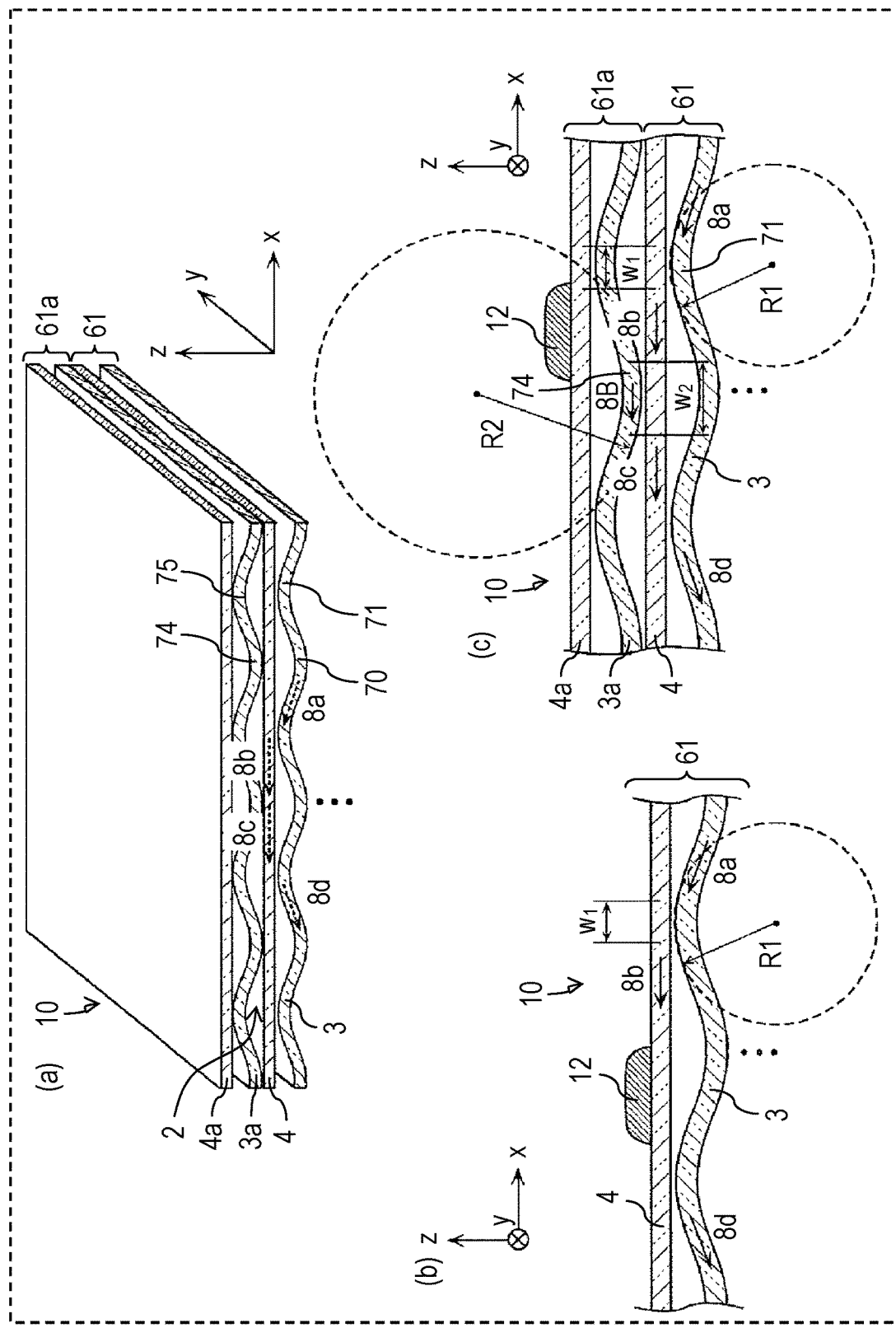

Part (a) of FIG. 9 is a schematic view showing an outermost surface structure of the waveguide sheet according to the first exemplary embodiment. Parts (b) and (c) of FIG. 9 are schematic sectional views for explaining a relationship between a curvature radius of a meandering layer and shift of light.

Figure 10:
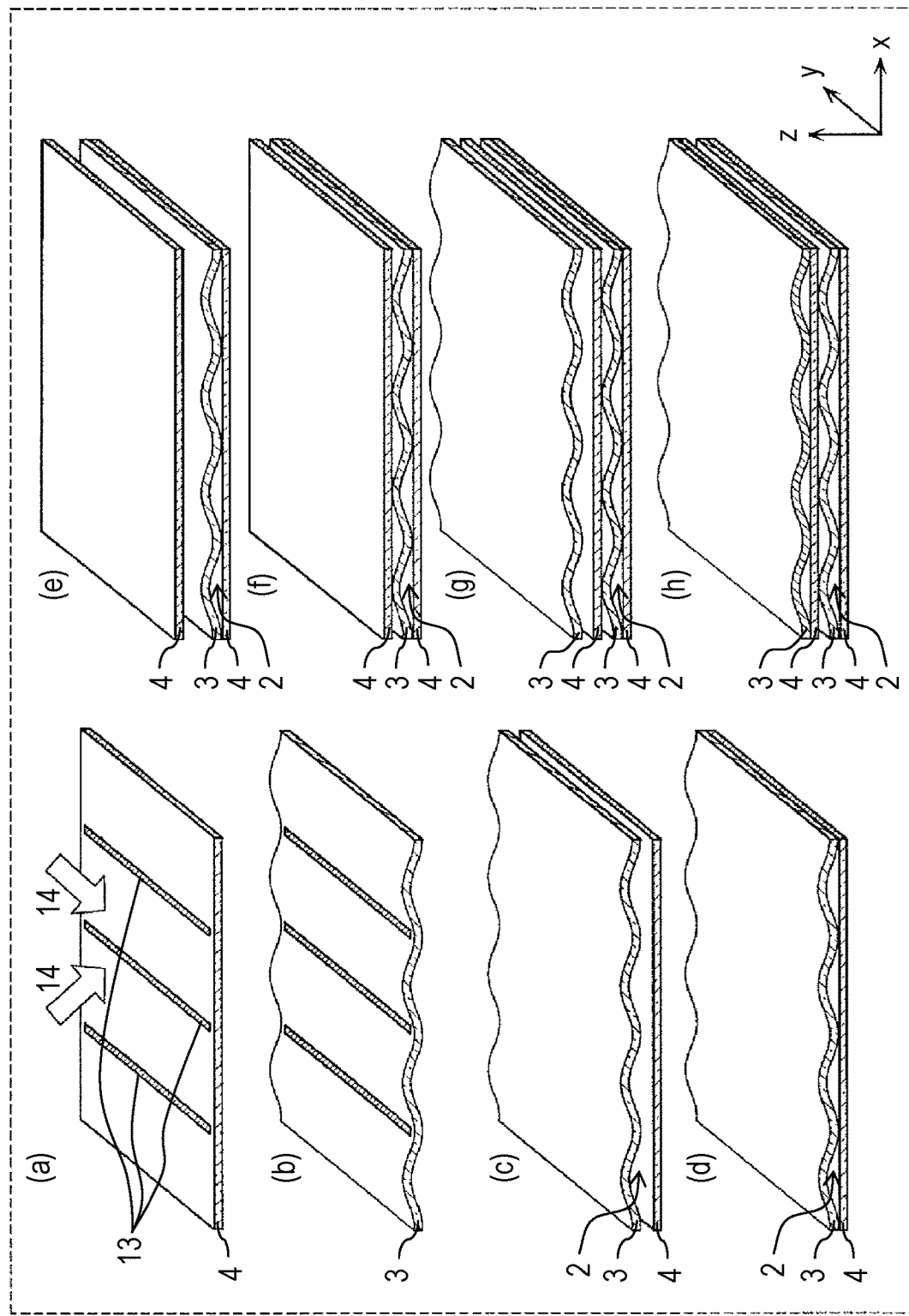

FIG. 10 is a schematic explanatory view showing an example of a procedure for manufacturing a waveguide sheet according to the first exemplary embodiment.

Figure 11:
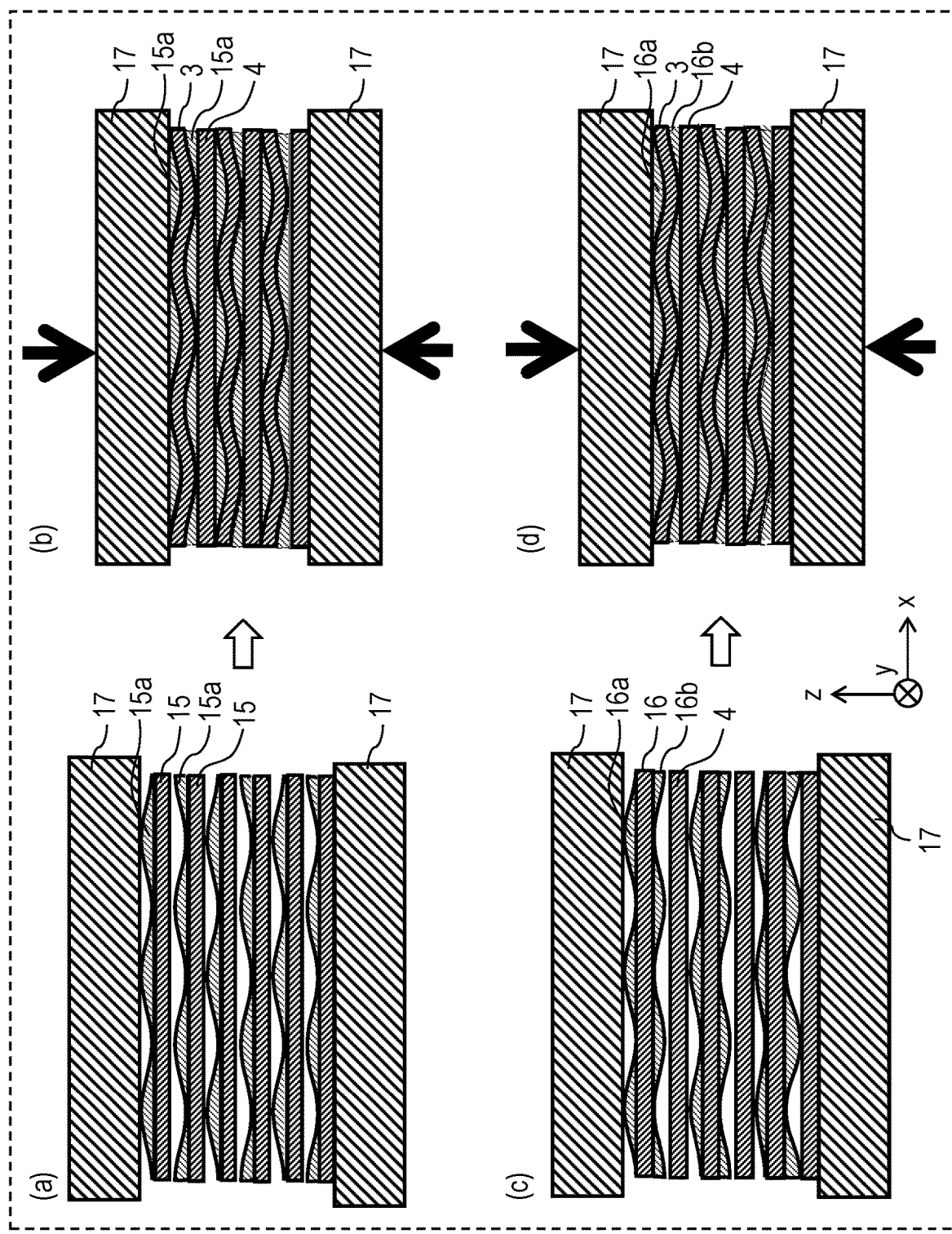

FIG. 11 is a schematic explanatory view showing an example of another procedure for manufacturing a waveguide sheet according to the first exemplary embodiment.

Figure 12:
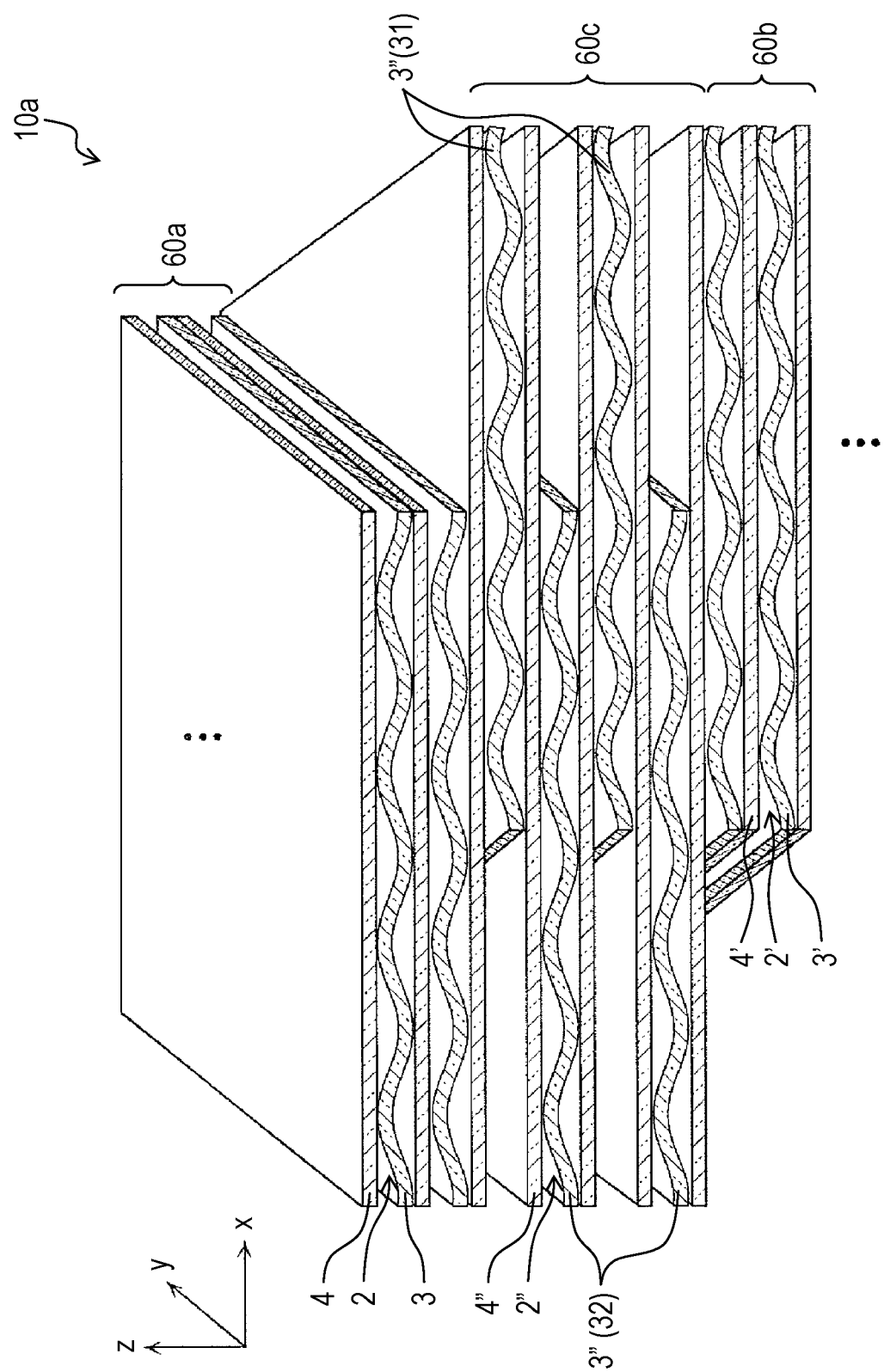

FIG. 12 is an explanatory view showing a schematic sectional view of a waveguide sheet according to a second exemplary embodiment.

Figure 13:
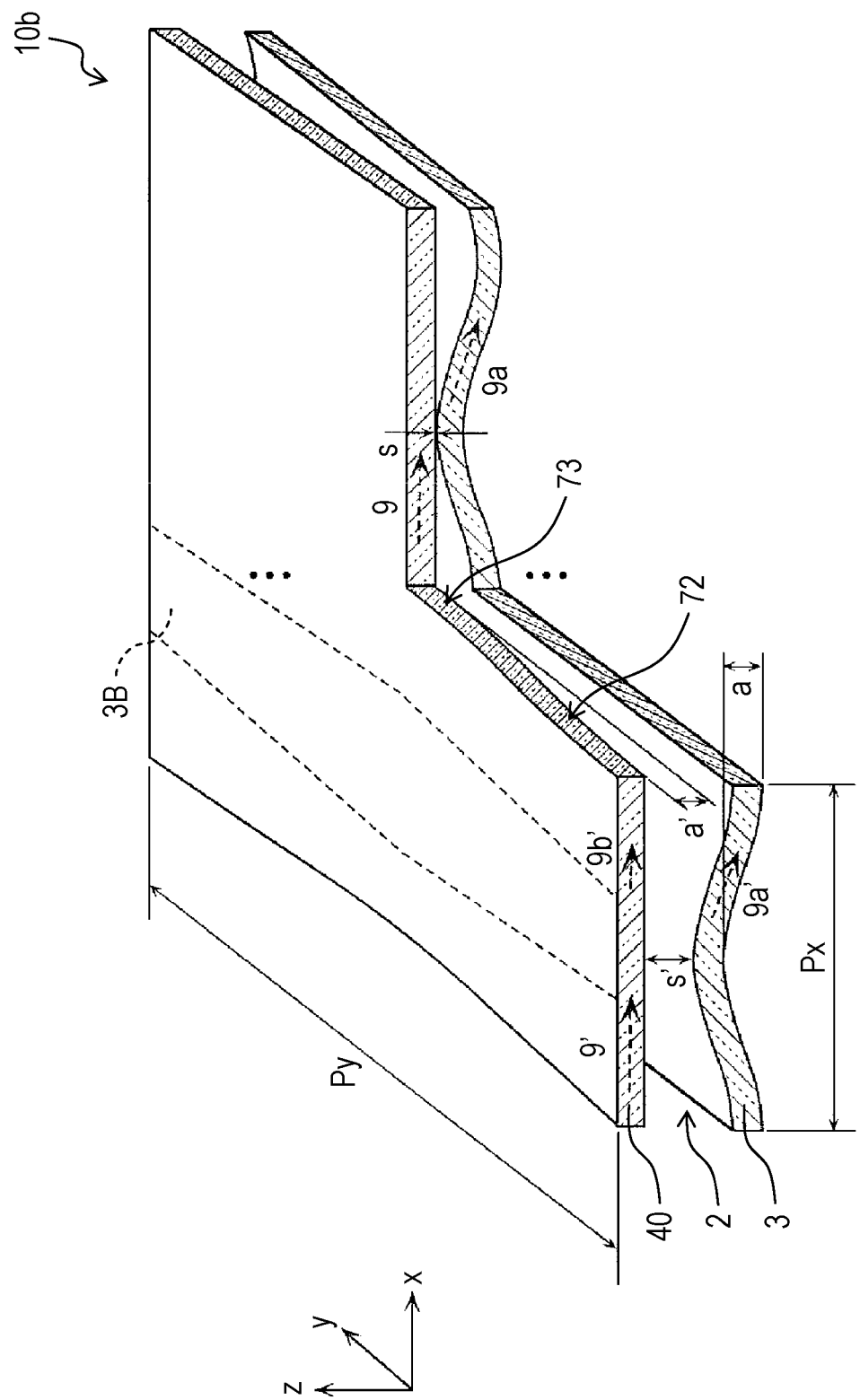

FIG. 13 is an explanatory view showing how waveguided light propagates in a waveguide sheet according to a third exemplary embodiment.

Figure 14:
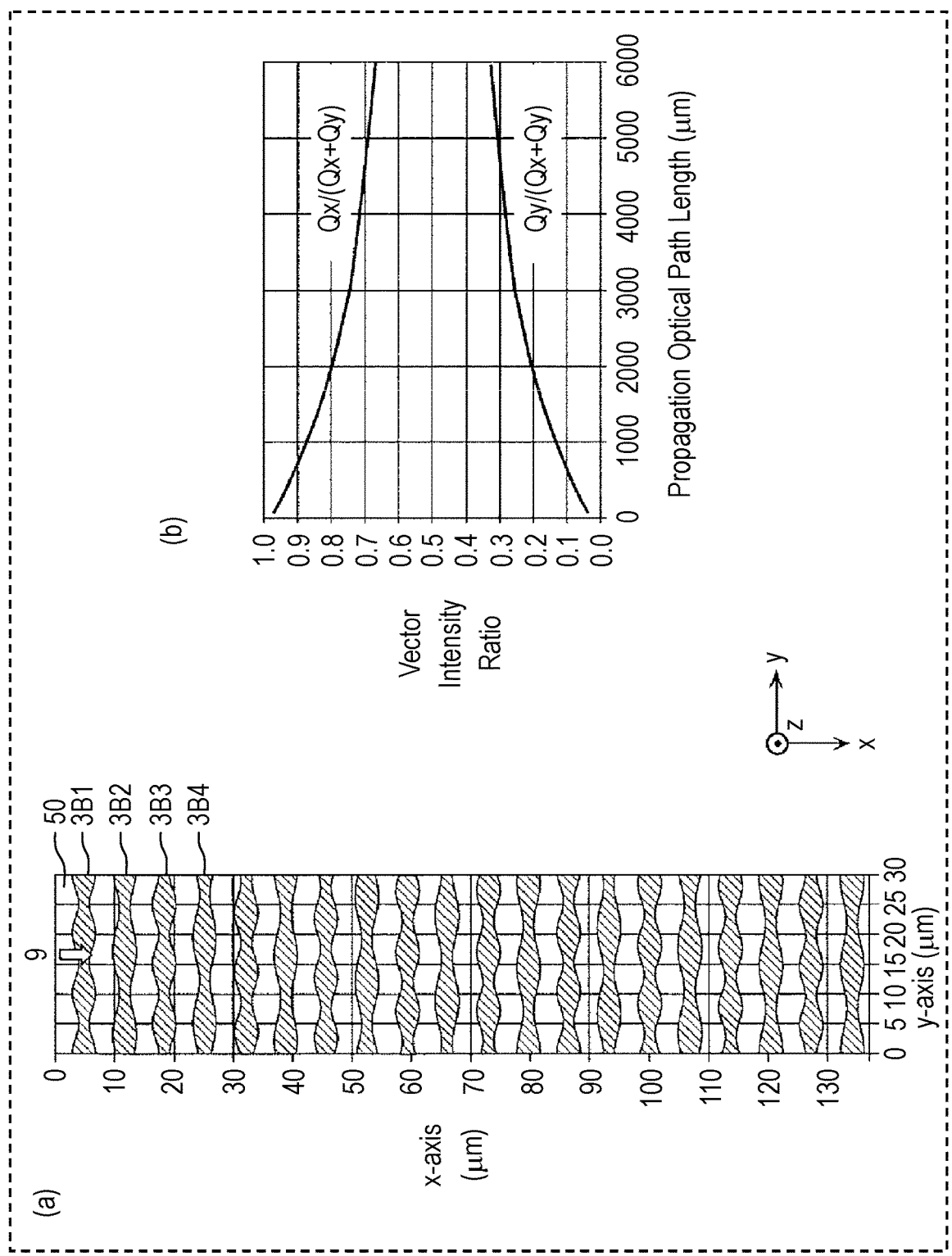

Part (a) of FIG. 14 is an explanatory view showing a refractive index distribution chart used in a simulation on a shift phenomenon of light in the waveguide sheet according to the third exemplary embodiment using a two-dimensional model. Part (b) of FIG. 14 is an explanatory graph showing propagation length dependence of a Poynting vector intensity ratio as a simulation result using a two-dimensional model showing a shift phenomenon of light shown in part (a) of FIG. 14.

Figure 15:
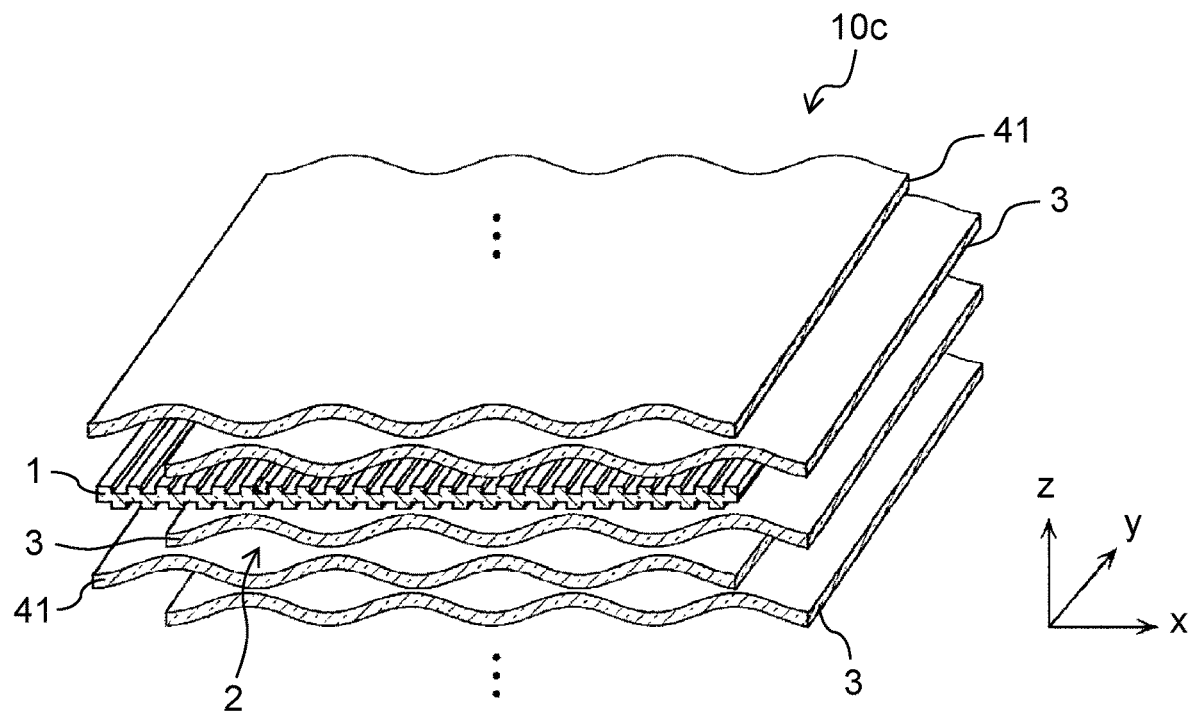

FIG. 15 is a schematic view showing a schematic section of a waveguide sheet according to a fourth exemplary embodiment.

Figure 16:
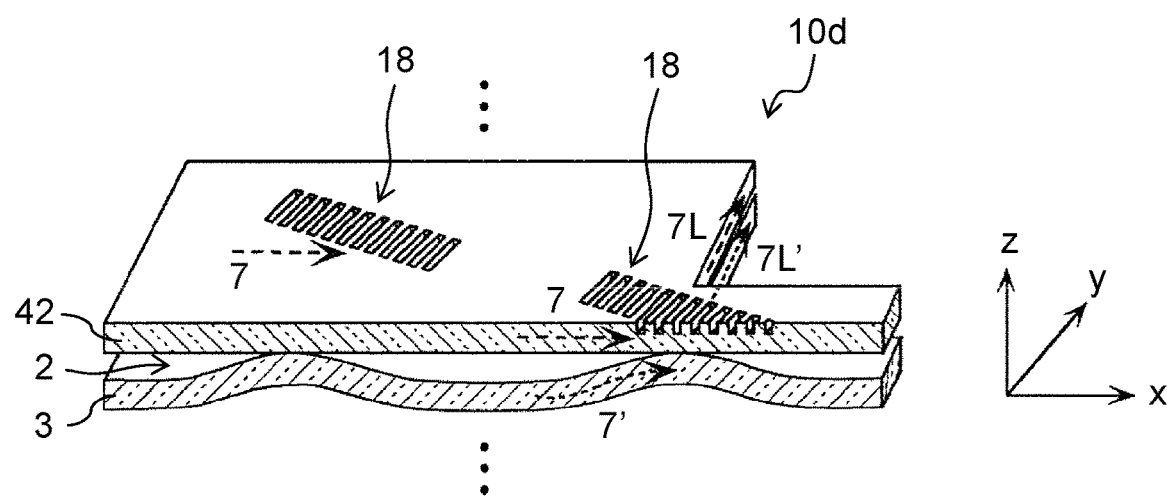

FIG. 16 is a schematic view showing a schematic section of a waveguide sheet according to a fifth exemplary embodiment.

Figure 17:
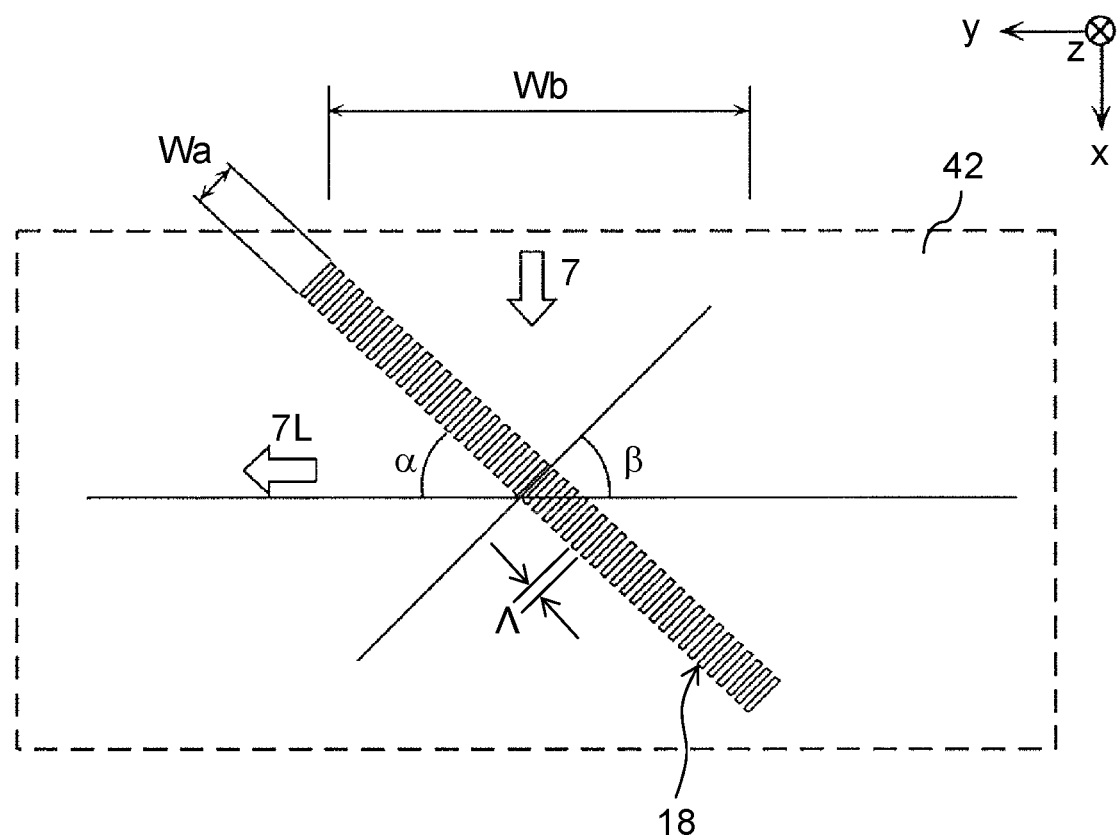

FIG. 17 is an explanatory view showing how a propagating direction of propagating light changes in the waveguide sheet according to the fifth exemplary embodiment.

Figure 18:
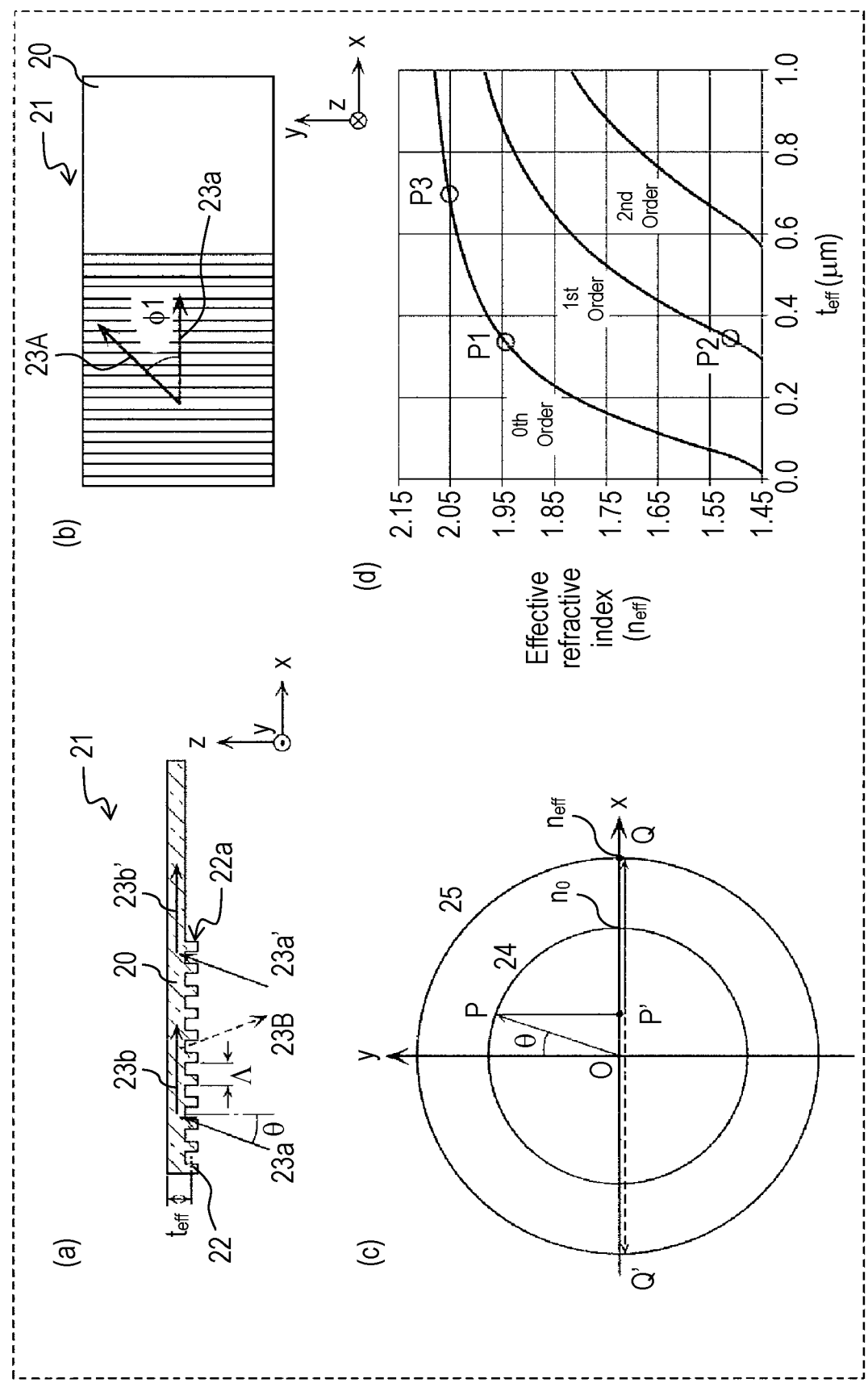

FIG. 18 is an explanatory view for explaining a principle of a grating coupling method.

DETAILED DESCRIPTION (Knowledge Underlying the Present Disclosure)

Viewpoints of present inventors will be described first.

Light is an elementary particle that continuously propagates at light speed. It is generally difficult to transfer light to a single light propagation medium and hold light inside the light propagation medium. As a conventional technique of capturing light from an environmental medium such as air into a transparent sheet, for example, a grating coupling method is available.

FIG. 18 is a view for explaining a principle of a grating coupling method. More specifically, part (a) of FIG. 18 is a sectional view of light-transmissive layer 20 having a surface provided with a linear grating (diffraction grating 22) with a pitch Λ, and part (b) of FIG. 18 is a plan view of light-transmissive layer 20 shown in part (a) of FIG. 18.

Light-transmissive layer 20 provided with diffraction grating 22 is called a grating coupler. As shown in part (a) of FIG. 18, when incident light 23a having a wavelength λ is incident on diffraction grating 22 at predetermined incident angle θ with respect to a normal to a surface of light-transmissive layer 20, on which diffraction grating 22 is formed, incident light 23a can be coupled to waveguided light 23b propagating in light-transmissive layer 20. In this case, light-transmissive layer 20 captures only incident light that satisfies predetermined conditions such as wavelength λ and incident angle θ, but does not capture any incident light that does not satisfy the conditions.

Part (c) of FIG. 18 is an explanatory view showing a vector diagram of incident light 23a in part (a) of FIG. 18.

Referring to part (c) of FIG. 18, circle 24 and circle 25 are centered on point O. A radius of circle 24 is set to be equal to refractive index $n_0$ of environmental medium 21 located around light-transmissive layer 20. A radius of circle 25 is set to be equal to an effective refractive index ($n_{eff}$) of waveguided light 23b. The effective refractive index ($n_{eff}$) depends on a thickness of light-transmissive layer 20, and takes a specific value between refractive index $n_0$ of environmental medium 21 and refractive index $n_1$ of light-transmissive layer 20 in accordance with a waveguide mode of propagating light propagating in light-transmissive layer 20. Point P is an intersection point between a line drawn from point O along incident angle θ (an inclination angle with respect to a y-axis) and circle 24. Point P' corresponds to a foot of a perpendicular drawn from point P to an x-axis (an intersection point between the perpendicular and the x-axis). Points Q and Q' are intersection points between circle 25 and the x-axis.

Part (d) of FIG. 18 shows a relationship (dispersion characteristic) between an effective thickness ($t_{eff}$) and the effective refractive index ($n_{eff}$) when waveguided light 23b propagates in a transverse electric (TE) mode. In this case, the effective thickness is a thickness of light-transmissive layer 20 itself when diffraction grating 22 is not present, whereas when diffraction grating 22 is present, the effective thickness is a sum of the thickness of light-transmissive layer 20 and an average height of diffraction grating 22. Note that part (d) of FIG. 18 shows a relationship between the effective thickness ($t_{eff}$) and the effective refractive index ($n_{eff}$) when environmental medium 21 surrounding light-transmissive layer 20 is $SiO_2$, and light-transmissive layer 20 is $Ta_2O_5$.

As shown in part (d) of FIG. 18, waveguided light propagating in light-transmissive layer 20 has a plurality of waveguide modes such as a 0th order mode, 1st order mode, and 2nd order mode, which are represented by different characteristic curves.

As shown in part (c) of FIG. 18, a coupling condition for light in a positive x-axis direction is that a length of P'Q is equal to an integer multiple of λ/Λ, and a coupling condition for light in a negative x-axis direction is that a length of P'Q' is equal to an integer multiple of λ/Λ. More specifically, the coupling condition for light in the positive x-axis direction is represented by equation (1) given below. Note that λ is a wavelength of light, Λ is a diffraction grating pitch, and q is an order of diffraction represented by an integer.

[Equation 1]

$$n_0 \sin \theta = \pm n_{eff} + q \frac{\lambda}{\Lambda} \quad (1)$$

In equation (1), when $n_0$, $n_{eff}$, q, λ, Λ, and θ satisfy equation (1), incident light incident on light-transmissive layer 20 at an incident angle other than θ is not coupled to waveguided light in light-transmissive layer 20 if $n_0$, $n_{eff}$, q, λ, and Λ remain the same. In addition, when $n_0$, $n_{eff}$, q, λ, Λ, and θ satisfy equation (1), incident light incident on light-transmissive layer 20 at a wavelength other than λ is not coupled to waveguided light in light-transmissive layer 20 if $n_0$, $n_{eff}$, q, Λ, and θ remain the same.

The above description concerns a case in which incident light 23a is incident in a direction perpendicular to a direction in which diffraction grating 22 extends on a surface of light-transmissive layer 20. As shown in part (b) of FIG. 18, consider a case in which incident light 23A shifted (rotated) by rotational angle φ1 from a direction in which incident light 23a is incident on light-transmissive layer 20 (a direction perpendicular to an extending direction of diffraction grating 22) is incident on light-transmissive layer 20. In this case, a substantial pitch of diffraction grating 22 is Λ/cos φ1. Accordingly, incident light whose incident direction is shifted (rotated) from incident light incident on light-transmissive layer 20 sometimes satisfies coupling conditions for light even at a different incident angle and a different wavelength under conditions ($n_0$, $n_{eff}$, q, λ, Λ, and θ) satisfying equation (1). This relaxes the coupling conditions for incident light to waveguided light on light-transmissive layer 20 to some extent. However, limitations still remain on incident angles and wavelengths.

In addition, while waveguided light 23b propagates in region of diffraction grating 22, waveguided light 23b is radiated as radiation light 23B in a direction toward a surface of light-transmissive layer 20, on which diffraction grating 22 is formed, on which incident light is incident. For this reason, even if incident light is incident at a position away from an end portion (grating end portion 22a) of diffraction grating 22 formed on a surface of light-transmissive layer 20 and can propagate as waveguided light 23b in light-transmissive layer 20, waveguided light 23b is attenuated when reaching grating end portion 22a. That is, waveguided light 23b is radiated as radiation light 23B to outside light-transmissive layer 20 without reaching grating end portion 22a. Accordingly, only incident light 23a' incident at a position near grating end portion 22a can propagate as waveguided light 23b' in light-transmissive layer 20 without being attenuated due to radiation. That is, even if an area of diffraction grating 22 is increased to couple much incident light as waveguided light inside light-transmissive layer 20, not all incident light incident on diffraction grating 22 can be made to propagate as waveguided light 23b'. In consideration of the above problem, the present inventors have created the present disclosure.

Exemplary embodiments will be described in detail below with reference to the drawings as appropriate. However, description that is more detailed than necessary may be omitted. For example, a detailed description of a well-known matter and a duplicated description of substantially the same configuration will be omitted in some cases. This is to avoid unnecessary redundancy of the following description and to facilitate understanding by those skilled in the art.

Note that the inventors of the present disclosure provide the attached drawings and the following description in order to allow those skilled in the art to fully understand the present disclosure, and do not intend to limit the subject matter as described in the appended claims.

An x-axis and a y-axis in the drawings coincide with directions orthogonal to a z-axis. Assume that the x-axis coincides with a direction orthogonal to the y-axis. In this specification, a positive direction of the z-axis is defined as "above". In addition, a z-axis direction is sometimes written as a stacking direction.

In this specification, terms "above" and "below" do not indicate an upward direction (vertically above) and a downward direction (vertically below) in terms of absolute spatial recognition. In addition, the terms "above" and "below" apply to not only a case in which two constituent elements are spaced apart from each other and another constituent element is present between the two constituent elements but a case in which two constituent elements are disposed in tight contact with each other and are in contact with each other.

In this specification, "parallel" includes "almost parallel", that is, a manufacturing error.

First Exemplary Embodiment

Figure 1:
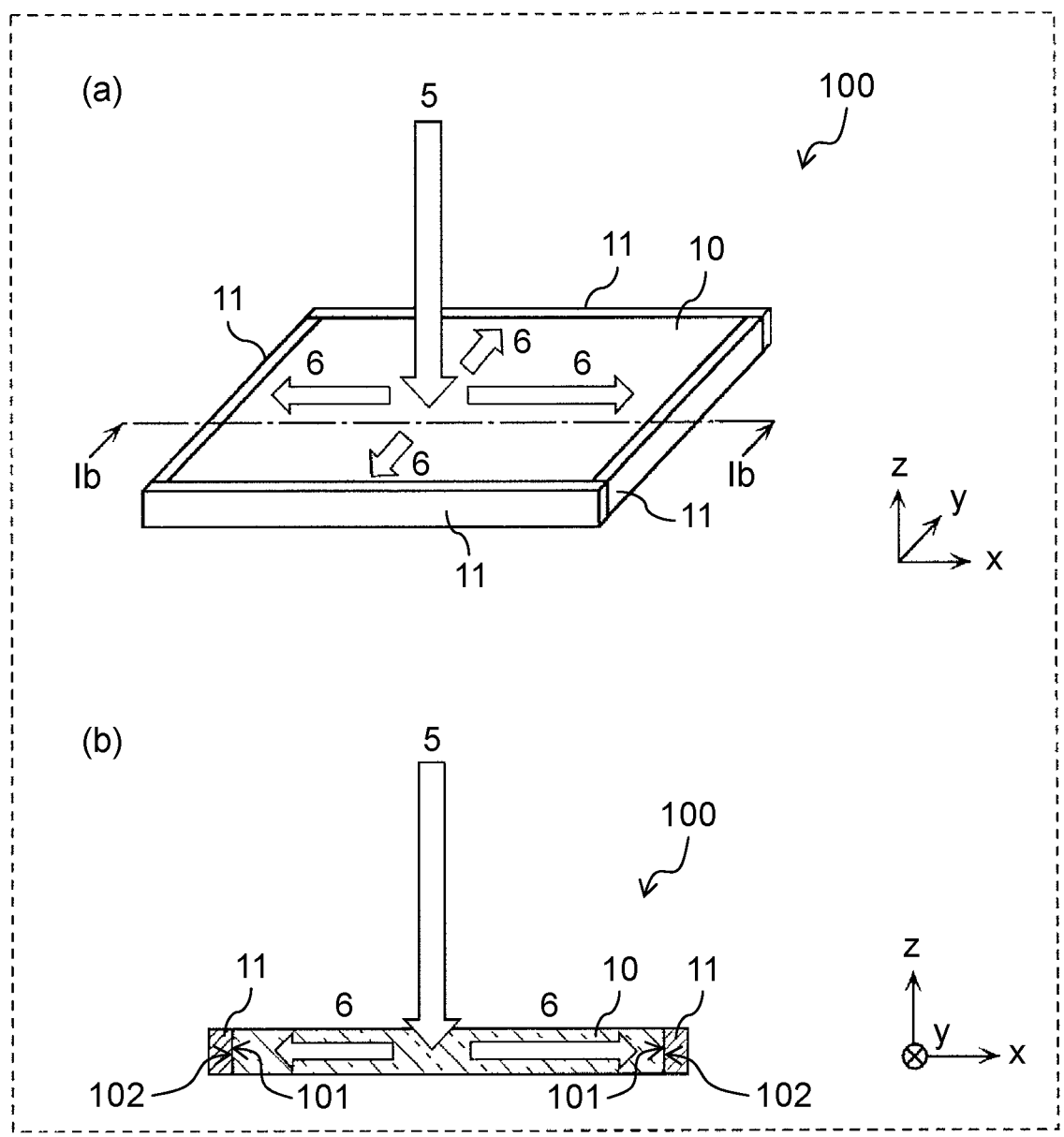

A first exemplary embodiment will be described below with reference to FIGS. 1 to 11.
[Structure of Waveguide Sheet]
Part (a) of FIG. 1 is a schematic perspective view showing a photoelectric conversion device according to the first exemplary embodiment. Part (b) of FIG. 1 is a sectional view showing a section of the photoelectric conversion device shown in part (a) of FIG. 1 taken along Ib-Ib.

As shown in FIG. 1, photoelectric conversion device 100 includes waveguide sheet 10 and photoelectric conversion element 11 disposed on end face 102 of waveguide sheet 10.

Photoelectric conversion device 100 is a device that captures incident light 5 such as sunlight or illumination light into waveguide sheet 10 and converts incident light 5 into power. In other words, incident light 5 is captured into waveguide sheet 10 and coupled to waveguided light 6 inside waveguide sheet 10. Waveguided light 6 propagates in waveguide sheet 10 and reaches end face 102 of waveguide sheet 10. Waveguided light 6 that has reached end face 102 is received by light-receiving surface 101 of photoelectric conversion element 11 and converted into power.

Photoelectric conversion element 11 converts received light into power. A specific example of photoelectric conversion element 11 is a solar cell. As a material for photoelectric conversion element 11, for example, a semiconductor such as crystal silicon, single crystal silicon, or polycrystal silicon is used. Alternatively, as a material for photoelectric conversion element 11, for example, a compound semiconductor such as GaAs or InGaAs is used.

Photoelectric conversion element 11 is disposed around waveguide sheet 10 so as to cover end face 102 of waveguide sheet 10. More specifically, photoelectric conversion element 11 is disposed around waveguide sheet 10 such that light-receiving surface 101 is located to face end face 102 of waveguide sheet 10 in a direction intersecting with a light-receiving direction of incident light 5 incident on waveguide sheet 10. Waveguided light 6 captured by waveguide sheet 10 exits from end face 102 of waveguide sheet 10 and is received by photoelectric conversion element 11. Photoelectric conversion element 11 converts received waveguided light 6 into power.

Waveguide sheet 10 is an optical sheet that internally captures incident light 5. Waveguide sheet 10 internally holds captured incident light 5 to couple incident light 5 to waveguided light 6 and make the resultant light propagate to end face 102 of waveguide sheet 10. More specifically, waveguide sheet 10 captures incident light 5 and changes a traveling direction of incident light 5 to guide the light to end face 102 of waveguide sheet 10 located at a position in a direction intersecting with the light-receiving direction. More specifically, waveguide sheet 10 captures incident light 5 and couples the light to waveguided light 6 traveling (waveguided) inside waveguide sheet 10 in a direction different from the traveling direction of incident light 5. In addition, waveguide sheet 10 has a function of guiding waveguided light 6 to end face 102 while suppressing radiation outside waveguide sheet 10 (more specifically, toward the z-axis direction shown in FIG. 1).

Figure 2:
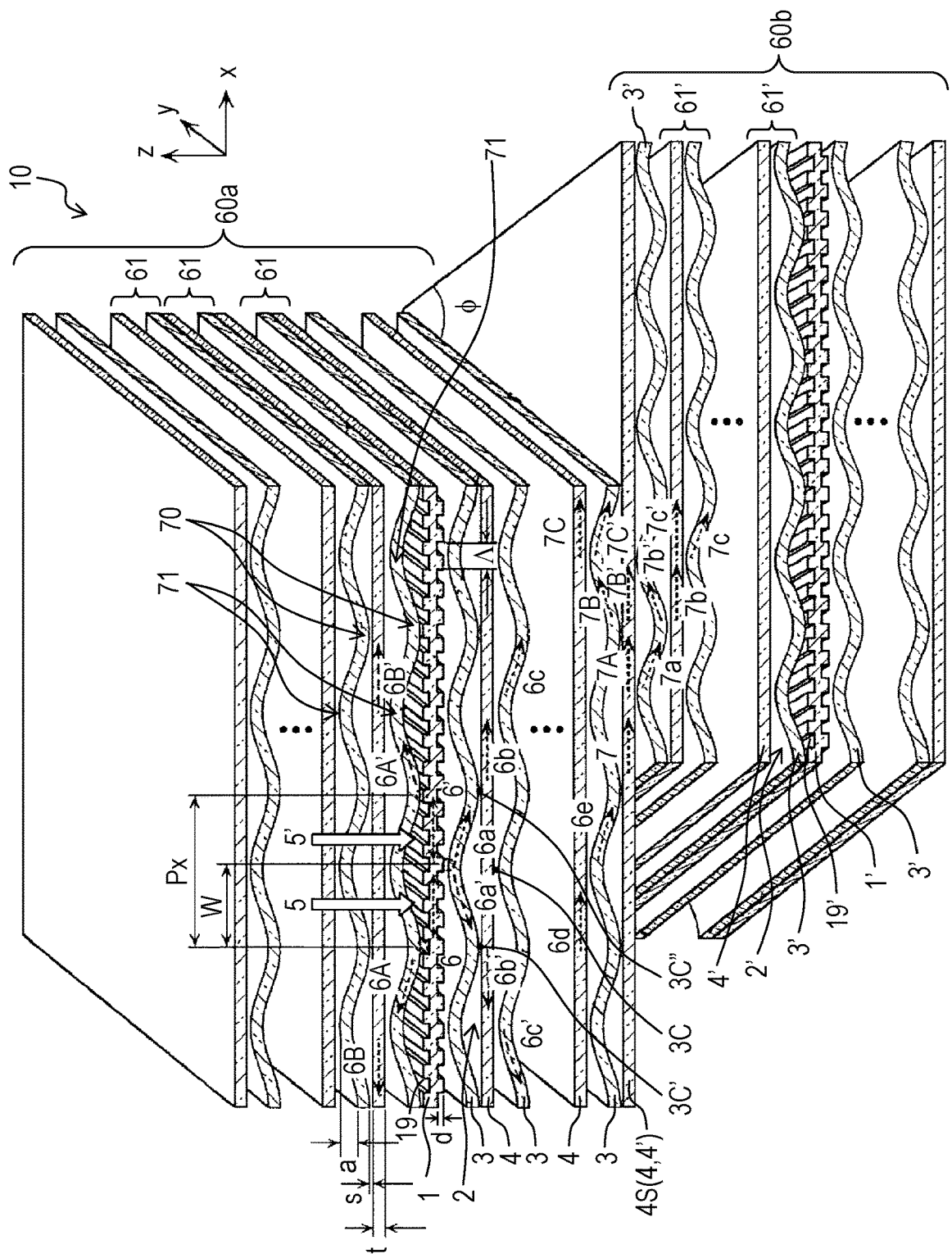
FIG. 2 is a schematic view showing a schematic section for explaining how light is incident on a waveguide sheet according to a first exemplary embodiment.

FIG. 2 is a schematic enlarged sectional view of a part of waveguide sheet 10. More specifically, FIG. 2 is a schematic view showing a schematic section for explaining how light is input to and propagates in waveguide sheet 10 according to the first exemplary embodiment. As shown in FIG. 2, waveguide sheet 10 includes laminated body 60a (first laminated body) and laminated body 60b (second laminated body).

Laminated body 60a is a laminated structure including diffraction grating layer 1, meandering layer 3 (first light-transmissive layer), and parallel layer 4 (second light-transmissive layer). More specifically, laminated body 60a includes diffraction grating layer 1 that changes the traveling direction of incident light 5. Laminated body 60a further includes meandering layer 3 laminated on diffraction grating layer 1 and having a shape with first concave streaks 70 and first convex streaks 71 being repeatedly formed in a first direction that is a direction intersecting with an incident direction of incident light 5. In addition, laminated body 60a includes parallel layer 4 laminated on meandering layer 3. A combination of meandering layer 3 and parallel layer 4 laminated on meandering layer 3 will be referred to as light-transmissive pair 61 (first light-transmissive pair). Laminated body 60a includes a plurality of light-transmissive pairs 61 that are laminated on each other. In this case, first concave streaks 70 and first convex streaks 71 are respectively a concave streak and a convex streak extending in the y-axis direction.

A plurality of light-transmissive pairs 61 are laminated on each other such that positions of adjacent first convex streaks 71 of each meandering layer 3 are on both sides of first concave streak 70 of another meandering layer 3 adjacent to meandering layer 3 in the incident direction of incident light 5.

Diffraction grating layer 1 is a layer having light-transmissivity on which diffraction gratings 19 are formed on surfaces (upper and lower surfaces) parallel to an xy plane shown in FIG. 2 at diffraction grating pitch A and diffraction grating depth d. Diffraction gratings 19 extend in the y-axis direction, and each have a linear shape and a rectangular section. On an upper surface side and a lower surface side of diffraction grating layer 1, meandering layers 3, each meandering on an xy plane at pitch Px along the x-axis, and parallel layers 4, each parallel to an xy plane, are alternately laminated (disposed) on each other.

Diffraction grating layer 1 captures incident light 5. In addition, diffraction grating layer 1 internally holds captured incident light 5, couples incident light 5 to waveguided light 6, and waveguides resultant waveguided light 6 to meandering layer 3 laminated on diffraction grating layer 1. More specifically, diffraction grating layer 1 captures incident light 5 and changes the traveling direction of incident light 5 to waveguide incident light 5 to end face 102 of waveguide sheet 10 located in a direction intersecting with the light-receiving direction. Waveguided light 6 waveguided in diffraction grating layer 1 shifts to meandering layer 3 laminated on diffraction grating layer 1.

Each meandering layer 3 is an optical sheet having optical transparency. Meandering layer 3 is a layer having a wavy shape in the first direction (the x-axis direction in FIG. 2) in a sectional view (a surface cut along an xz plane shown in FIG. 2) and meandering in the first direction. More specifically, as meandering layer 3 is formed into a meandering shape, diffraction grating layer 1 located on the upper surface side (or the lower surface side) of meandering layer 3 and meandering layer 3 repeatedly come close to and separate from each other in the laminating direction. Note that "to come close to" includes "to come into contact with" and "not to come into contact with". That is, meandering layer 3 is laminated on diffraction grating layer 1 and has a shape with first concave streaks 70 and first convex streaks 71 being repeatedly formed in the first direction that is a direction intersecting with the incident direction of incident light 5. A meandering direction (x-axis direction) in which first concave streaks 70 and first convex streaks 71 of meandering layer 3 are repeatedly formed is substantially the same as an arranging direction of diffraction gratings 19.

First concave streaks 70 and first convex streaks 71 each may be formed to have a predetermined curvature in a sectional view. More specifically, first concave streaks 70 and first convex streaks 71 may be formed so as not to have any angular portion in a sectional view.

In the following description, a direction in which concave and convex streaks are repeatedly formed is sometimes written as a meandering direction. Referring to FIG. 2, a total amplitude of meandering of each meandering layer 3 in a z direction is referred to as amplitude a. In this specification, amplitude a is an interval between a farthest point on the upper surface side in the positive z-axis direction and a farthest point on the upper surface side in the negative z-axis direction in the laminating direction (z-axis direction).

Each parallel layer 4 is an optical sheet having optical transparency. In the first exemplary embodiment, parallel layer 4 is an optical sheet with an upper surface and a lower surface, located in the laminating direction of parallel layer 4, being formed almost parallel to each other.

Laminated body 60a has each parallel layer 4 laminated on corresponding meandering layer 3. Laminated body 60a includes a plurality of light-transmissive pairs 61 each having parallel layer 4 laminated on meandering layer 3.

As a material for diffraction grating layer 1, meandering layer 3, and parallel layer 4, for example, a transparent resin such as acrylic or a transparent high-refractive-index dielectric material such as $Ta_2O_5$ or SiN. More specifically, a material used for diffraction grating layer 1, meandering layer 3, and parallel layer 4 is higher in refractive index than a material used for transparent layer 2 located between diffraction grating layer 1, meandering layer 3 and parallel layer 4.

Because each meandering layer 3 has a meandering shape, transparent layers 2 are respectively interposed between meandering layer 3 and diffraction grating layer 1 and between meandering layer 3 and parallel layer 4.

Transparent layer 2 is a layer located between meandering layer 3 and parallel layer 4 and having optical transparency. As a material for transparent layer 2, for example, a fluorine resin lower in refractive index than diffraction grating layer 1, meandering layer 3, and parallel layer 4 or a low-refractive-index dielectric material such as $SiO_2$ is used. Note that transparent layer 2 is only required to be lower in refractive index than diffraction grating layer 1, meandering layer 3, and parallel layer 4, and may be air.

Laminated body 60a has light-transmissive pairs 61 laminated on each other such that meandering layers 3 are respectively located on one side (upper side) of diffraction grating layer 1 in the laminating direction and the other side (lower side) opposite to one side. Upper and lower meandering layers 3 are disposed with respect to diffraction grating layer 1 such that adjacent first concave streaks 70 of meandering layer 3 on one side are located on both sides of first convex streak 71 of meandering layer 3 on the other side.

The plurality of light-transmissive pairs 61 are laminated on each other such that positions at which parallel layer 4 and meandering layer 3 on one surface of parallel layer 4 come close to each other in the first direction (meandering direction) are on both sides of a position at which parallel layer 4 and meandering layer 3 on the other surface opposite to one surface of parallel layer 4 come close to each other. More specifically, the plurality of light-transmissive pairs 61 are laminated on each other as follows. As shown in FIG. 2, adjacent nearby portions 3C' and 3C" between meandering layer 3 and parallel layer 4 on one surface (upper surface) of parallel layer 4 in the x-axis direction are located on both sides of nearby portion 3C between meandering layer 3 and parallel layer 4 on the other surface (lower surface) of parallel layer 4. In other words, the plurality of light-transmissive pairs 61 are laminated on each other such that positions of adjacent first convex streaks 71 of meandering layer 3 are on both sides of first concave streak 70 of the other meandering layer 3 adjacent to meandering layer 3 as seen in the incident direction.

As a specific example, meandering periods of wavy shapes of respective meandering layers 3 disposed in a laminated form are preferably synchronous with each other in a sectional view. In other words, positions of first convex streaks 71 and positions of first concave streaks 70 of meandering layers 3 disposed in a laminated form preferably almost coincide with each other in the laminating direction in a sectional view.

Laminated body 60b has a structure similar to that of laminated body 60a, and has a laminated structure having diffraction grating layer 1', meandering layers 3', and parallel layers 4' laminated on each other. In this case, laminated body 60b is equivalent to that obtained by rotating laminated body 60a by rotational angle φ about the z-axis. Accordingly, a meandering direction (third direction) of meandering layer 3' of laminated body 60b is rotated by rotational angle φ about the z-axis from the meandering direction (first direction) of meandering layer 3 of laminated body 60a. More specifically, like laminated body 60a, laminated body 60b has meandering layers 3' respectively laminated on and under diffraction grating layer 1' on which diffraction gratings 19' are formed. In addition, laminated body 60b includes light-transmissive pairs 61' each having meandering layer 3' and parallel layer 4' laminated on each other. Because each meandering layer 3' has a meandering shape, transparent layers 2' are respectively interposed between meandering layer 3' and diffraction grating layer 1' and between meandering layer 3' and parallel layer 4'.

Diffraction grating layer 1' of laminated body 60b captures incident light 5 and couples incident light 5 to waveguided light. Laminated body 60b is laminated on laminated body 60a such that a waveguiding direction of waveguided light captured by diffraction grating layer 1' differs from that of diffraction grating layer 1 of laminated body 60a. In this case, the waveguiding direction is a main waveguiding direction in which a largest amount of waveguided light, of waveguided light propagating in waveguide sheet 10, is waveguided.

Parallel layer 4S is disposed between laminated body 60a and laminated body 60b. Parallel layer 4S at a boundary between laminated body 60a and laminated body 60b is a common layer corresponding to both parallel layer 4 and parallel layer 4'.

Assume that thicknesses of meandering layer 3 and parallel layer 4 and an effective thickness of diffraction grating layer 1 (an average thickness of concave and convex portion of the grating) each are thickness t. In addition, a gap between meandering layer 3 and parallel layer 4 and a gap between meandering layer 3 and diffraction grating layer 1 each are gap s.

Note that in the following description, unless otherwise specified, a material for diffraction grating layer 1, meandering layer 3, and parallel layer 4 is $Ta_2O_5$, a material for transparent layer 2 is $SiO_2$, meandering pitch Px=5.85 μm (micrometer/micron), thickness t=0.34 μm, amplitude a=0.30 μm, gap s=0 μm, diffraction grating pitch Λ=0.45 μm, and diffraction grating depth d=0.16 μm. In the following description, the above conditions are sometimes referred to as conditions A.

Conditions A are specific examples of structures of diffraction grating layer 1, meandering layer 3, and parallel layer 4, but do not limit any dimensions and materials. The conditions for the dimensions of diffraction grating layer 1, meandering layer 3 and parallel layer 4 may be changed as needed in accordance with, for example, a material for diffraction grating layer 1, meandering layer 3, and parallel layer 4. A dispersion characteristic of diffraction grating layer 1, meandering layer 3, and parallel layer 4 corresponds to point P1 shown in part (d) of FIG. 18.

A manner of how light is input and propagates in waveguide sheet 10 will be described with reference to FIG. 2. As shown in FIG. 2, incident light 5 and incident light 5' entering waveguide sheet 10 are incident on diffraction grating layer 1 of laminated body 60a, coupled by diffraction grating 19 formed on diffraction grating layer 1, and coupled to waveguided light 6 and waveguided light 6' propagating in diffraction grating layer 1.

Waveguided light 6 shifts to meandering layer 3 adjacent to a lower side of diffraction grating layer 1 to become waveguided light 6a, shifts to parallel layer 4 adjacent to a lower side of meandering layer 3 to become waveguided light 6b, and shifts to meandering layer 3 adjacent to a lower side of parallel layer 4 to become waveguided light 6c. The above shifts are repeated. A shift phenomenon of waveguided light occurs with respect to a shift layer nearest to the waveguided light (more specifically, meandering layer 3 or parallel layer 4 near the waveguided light). Theoretically, a shift efficiency of almost 100% can be achieved by optimizing a curvature radius of meander of meandering layer 3 (a wavy shape in a sectional view) or gap s.

Waveguided light 6 also shifts to meandering layer 3 adjacent to an upper side of diffraction grating layer 1 to become waveguided light 6A, and further shifts to parallel layer 4 adjacent to an upper side of meandering layer 3 to become waveguided light 6B. The above shifts are repeated.

Waveguided light 6' shifts to meandering layer 3 adjacent to the lower side of diffraction grating layer 1 to become waveguided light 6a', shifts to parallel layer 4 adjacent to the lower side of meandering layer 3 to become waveguided light 6b', and shifts to meandering layer 3 adjacent to the lower side of parallel layer 4 to become waveguided light 6c'. The above shifts are repeated.

Waveguided light 6' also shifts to meandering layer 3 adjacent to the upper side of diffraction grating layer 1 to become waveguided light 6A', and shifts to parallel layer 4 adjacent to the upper side of meandering layer 3 to become waveguided light 6B'. The above shifts are repeated.

Diffraction gratings 19 formed on diffraction grating layer 1 are preferably formed on the entire xy planes (upper and lower surfaces) of diffraction grating layer 1. This allows diffraction grating layer 1 to capture incident light 5 in a wide region (area) and couple captured incident light 5 to waveguided light 6 when incident light 5 is incident on diffraction grating layer 1.

As a result of the above repeated shifts of the waveguided light, waveguided light 6c reaches parallel layer 4S at a boundary between laminated body 60a and laminated body 60b to become waveguided light 7. Because laminated body 60a and laminated body 60b are in contact with each other at a predetermined angle around the z-axis, nearby portion 3A (see FIG. 8) near meandering layer 3 on an upper surface side of parallel layer 4S intersects with nearby portion 3A' (see FIG. 8) near meandering layer 3' located below parallel layer 4S at parallel layer 4S at the boundary. More specifically, nearby portion 3A extending in a direction perpendicular to the meandering direction of meandering layer 3 intersects with nearby portion 3A' extending in a direction perpendicular to the meandering direction of meandering layer 3'. As described above, the meandering direction of meandering layer 3 of laminated body 60a differs from the meandering direction of meandering layer 3' of laminated body 60b. Under such conditions, a shift efficiency of light shifting from a layer in which waveguided light is waveguided to another layer decreases. For example, part of waveguided light 7 shifts to meandering layer 3' adjacent on the lower side to become waveguided light 7a, whereas the remaining part of waveguided light 7 which has not shifted to meandering layer 3' remains in parallel layer 4S to become waveguided light 7A.

Because laminated body 60b is laminated on laminated body 60a upon being rotated about the z-axis, the meandering direction of meandering layer 3' is greatly different from the propagating direction of waveguided light 7a. Thus, when incident light is incident on laminated body 60b, the incident light is waveguided in a second waveguiding direction different from a first waveguiding direction (a waveguiding direction in which light captured by diffraction grating layer 1 is waveguided). This difference causes waveguided light 7a and light derived from waveguided light 7a (for example, waveguided light 7b, 7c etc.) to repeatedly separate from each other for each shift while shift efficiency of the light keeps decreasing (see FIG. 7). For example, as shown in FIG. 2, waveguided light 7a is separated into waveguided light 7b and waveguided light 7b', and waveguided light 7b is separated into waveguided light 7c and waveguided light 7c'.

Propagating directions of both waveguided light 7a and waveguided light 7A deviate from an xz plane, and hence a shift efficiency of waveguided light 7A remaining in parallel layer 4S to meandering layer 3 also decreases, and separation is repeated for each shift (see FIG. 7). For example, waveguided light 7A is separated into waveguided light 7B and waveguided light 7B', and waveguided light 7B is separated into waveguided light 7C and waveguided light 7C'.

For example, when each shift efficiency is 50%, amounts of waveguided light 7a, waveguided light 7b, waveguided light 7c respectively decrease to ½, ¼, ⅛, so do amounts of waveguided light 7A, waveguided light 7B, waveguided light 7C, and energy of waveguided light is attenuated with an increase in distance from parallel layer 4S. In other words, waveguided light 7 that has reached parallel layer 4S at the boundary between laminated body 60a and laminated body 60b is subsequently confined in meandering layer 3 near parallel layer 4S, meandering layer 3', parallel layer 4, parallel layer 4', or parallel layer 4S. The confined waveguided light propagates in any of the above-described layers as waveguided light diffused along an xy plane. As shown in part (a) of FIG. 1, the waveguided light is received by photoelectric conversion element 11 attached around end face 102 of waveguide sheet 10.

In the following description, diffraction grating layers 1, 1', transparent layers 2, 2', meandering layers 3, 3', and parallel layers 4, 4' are sometimes collectively referred to as diffraction grating layer 1, transparent layer 2, meandering layer 3, and parallel layer 4, respectively.

An analysis result (simulation result) on how light captured in waveguide sheet 10 propagates in waveguide sheet 10 will be described next.

FIG. 3 is an explanatory view showing how light (incident light 5) is input to diffraction grating layer 1 according to the first exemplary embodiment. More specifically, part (a) of FIG. 3 is a schematic sectional view showing diffraction grating layer 1 according to the first exemplary embodiment. Part (b) of FIG. 3 is an explanatory view for explaining a coherence length of incident light on diffraction grating layer 1. Part (c) of FIG. 3 is an explanatory view showing how light is incident on diffraction grating layer 1 shown in part (a) of FIG. 3 and the input light propagates in a diffraction grating. More specifically, part (a) of FIG. 3 shows a two-dimensional model obtained by cutting diffraction grating layer 1 shown in FIG. 2 on which diffraction gratings 19 are formed within a range of coupling length W. Note that diffraction grating layer 1 satisfies conditions A described above. In addition, coupling length W is set to half of meandering pitch Px (see FIG. 2). Assume that diffraction grating layer 1 is surrounded by transparent layer 2. Part (b) of FIG. 3 is a light intensity distribution chart showing a simulation result on a case in which light with width (spot diameter)=coupling length W=5.6 μm and wavelength λ=0.85 μm is made to be incident on diffraction grating layer 1 shown in part (a) of FIG. 3 vertically with respect to an xy plane of diffraction grating layer 1 and coupled to become waveguided light 6.

In this case, an effective refractive index of diffraction grating layer 1 is calculated as $n_{eff}$=1.95 from point P1 in part (d) of FIG. 18. This result indicates that a right side of equation (1) is −1.95+0.85/0.45=−0.06, and hence almost vertically incident light (incident angle θ=0°) is coupled to become waveguided light 6.

FIG. 4 is an explanatory graph showing a light input efficiency when incident light is incident on diffraction grating layer 1 shown in FIG. 3. More specifically, part (a) of FIG. 4 shows an analysis result on wavelength dependence indicating a light input efficiency with respect to a wavelength of incident light 5 shown in part (c) of FIG. 3. Part (b) of FIG. 4 shows an analysis result on angle dependence indicating a light input efficiency with respect to incident angle θ of incident light 5 shown in part (c) of FIG. 3. In this case, wavelength dependence is an efficiency (coupling efficiency) of coupling incident light 5, captured in diffraction grating layer 1, to waveguided light 6 with respect to a wavelength when the wavelength of incident light 5 is changed. In addition, angle dependence is an efficiency (coupling efficiency) of coupling incident light 5, captured in diffraction grating layer 1, to waveguided light 6 with respect to incident angle θ when incident angle θ (see part (c) of FIG. 3) of incident light 5 is changed.

Note that pulse light was used as a light source for generating incident light 5 incident on diffraction grating layer 1. That is, incident light 5 used for this analysis was light with coherence length L (see part (b) of FIG. 3), which formed a homogeneous electromagnetic wave with wavelength λ within a range of time widths defined by L/C where C is a speed of light. In addition, an electromagnetic wave amplitude was set to 0 outside a range of coherence length L of incident light 5 used for the analysis, at which an electromagnetic wave was formed. In this case, coherence length L means a coherence length of incident light 5 incident on waveguide sheet 10. Each analysis result shown in FIG. 4 is plotted in accordance with coherence length L as a parameter.

As shown in part (a) of FIG. 4, when coherence length L is long (in a case of so-called coherent light), coupling efficiencies with respect to wavelengths are represented by acute curves with narrow peak widths, which has two peaks indicating high coupling efficiencies (corresponding to a 0th order mode and a 1st order mode of waveguided light 6) at a wavelength of 0.83 μm (corresponding to P1 in part (d) of FIG. 18) and a wavelength of 0.71 μm (corresponding to P2 in part (d) of FIG. 18). As coherence length L decreases (as incident light becomes so-called incoherent light), a plurality of peaks recognized become wide curves.

As shown in part (b) of FIG. 4, when coherence length L is long, the curve has two peaks indicating high coupling efficiencies (corresponding to a 0th order mode and a 1st order mode of waveguided light 6) at an incident angle of 0° (corresponding to P1 in part (d) of FIG. 18) and an incident angle of 21° (corresponding to P2 in part (d) of FIG. 18). In addition, the two peaks form acute curves with narrow peak widths. As coherence length L decreases, the two peaks form curves with wider peak widths.

In this case, assuming that the light source is the sun, coherence length L of sunlight is several micrometers. That is, properly setting diffraction grating pitch Λ of diffraction gratings 19 formed on diffraction grating layer 1 allows waveguide sheet 10 to reduce a change in input efficiency (coupling efficiency) in a wide wavelength range and a wide incident angle range when, for example, sunlight is incident.

Waveguided light propagating in meandering layer 3 and parallel layer 4 will be described next. Part (a) of FIG. 5 is a schematic sectional view showing an analysis model having a laminated structure obtained by alternately laminating a plurality of parallel layers 4 and a plurality of meandering layers 3, each adjacent pair of which sandwiches transparent layer 2, to analyze and check propagation of light in waveguide sheet 10 according to the first exemplary embodiment. Note that the analysis model is a two-dimensional model, and structure conditions for transparent layer 2, meandering layer 3, and parallel layer 4 used for the analysis complied with conditions A. Note, however, that meandering pitch Px of conditions A was changed to Px=10 μm. Analysis boundaries on right and left sides of a drawing plane shown in part (a) of FIG. 5 complied with periodic boundary condition (PBC), and analysis boundaries on upper and lower sides of the drawing plane complied with perfectly matched layer (PML). Referring to part (a) of FIG. 5, for the sake of easy explanation, meandering layers 3 and parallel layers 4 are indicated by hatching.

Parts (b) to (j) of FIG. 5 are explanatory views of analysis results corresponding to part (a) of FIG. 5 and illustrated in a time series in order of (b), (c), (d), . . . , (h), (i), and (j), each showing an intensity distribution of waveguided light propagating in meandering layer 3 and parallel layer 4 while shifting between meandering layer 3 and parallel layer 4.

When a light source with a wavelength of 0.85 μm is disposed on a left end in the drawing plane of meandering layer 3 located on an uppermost layer (on a positive z-axis direction side) and light is emitted from the light source in all directions, the light emitted from the light source is incident on meandering layer 3 and coupled to waveguided light 6f and waveguided light 6g in a TE mode propagating in meandering layer 3. As shown in part (b) of FIG. 5, because the analysis boundaries on the right and left of the drawing plane comply with PBC, waveguided light 6f and waveguided light 6g propagate from the left side of the drawing plane (negative x-axis direction side) and the right side of the drawing plane (positive x-axis direction side) to a central side of meandering layer 3 (a middle side of meandering layer 3 in the x-axis direction).

As shown in parts (d) and (e) of FIG. 5, waveguided light 6f and waveguided light 6g intersect with each other at a center of meandering layer 3 in the x-axis direction, shift to parallel layer 4 on the lower side of meandering layer 3, and propagate from the center of meandering layer 3 (parallel layer 4) to the right and left end sides. Waveguided light 6f that has reached the left end of the drawing plane appears from the right end of the drawing plane, and waveguided light 6g that has reached the right end of the drawing plane appears from the left end of the drawing plane. In this case, waveguided light 6f and waveguided light 6g shift to meandering layer 3 on a lower side of parallel layer 4. In this manner, waveguided light 6f and waveguided light 6g repeatedly shift between meandering layer 3 and parallel layer 4, located below, and propagate while a phenomenon that has occurred in parts (b) to (e) of FIG. 5 repeats in parts (f) to (j) of FIG. 5. The above analysis results indicate that waveguided light (waveguided light 6f and waveguided light 6g) captured in parallel layer 4 and meandering layer 3 does not easily leak from parallel layer 4 and meandering layer 3.

Like part (a) of FIG. 5, part (a) of FIG. 6 is a schematic view showing a section of a laminated structure obtained by alternately laminating parallel layers 4 and meandering layers 3, each adjacent pair of which sandwiches transparent layer 2, to analyze and check propagation of light in waveguide sheet 10 according to the first exemplary embodiment. Note that the analysis model is a two-dimensional model, and structure conditions complied with conditions A. Note, however, that meandering pitch Px was changed to Px=10 μm. Analysis boundaries on right and left sides (x-axis direction) of a drawing plane complied with periodic boundary condition (PBC), and analysis boundaries on upper and lower sides (z-axis direction) of the drawing plane complied with perfectly matched layer (PML).

Referring to part (a) of FIG. 6, unlike part (a) of FIG. 5, diffraction grating layer 1 was set at almost a center in a laminating direction of the laminated structure having parallel layers 4 and meandering layers 3 alternately laminated on each other. In addition, 10 sets (light-transmissive pairs 61) of parallel layers 4 and meandering layers 3 were stacked on each other on upper and lower sides of a drawing plane of part (a) of FIG. 6. In addition, meandering layers 3 were disposed on upper and lower sides in contact with diffraction grating layer 1. An outside of each set of parallel layer 4 and meandering layer 3 in the z-axis direction was made of the same material as that of transparent layer 2 ($SiO_2$) to the boundary (PML). In an analysis shown in FIG. 6, a light source with a width of 5 μm was disposed immediately near a boundary on the upper side of the drawing plane (positive z-axis direction side), and S-polarized incident light 5 was pulse-oscillated at a wavelength of 0.85 µm from the light source, with a length of 20 µm, toward the negative z-axis direction.

Parts (b) to (d) of FIG. 6 are explanatory views corresponding to the schematic view of part (a) of FIG. 6 and illustrated in a time series in order of (b), (c), and (d), each showing an intensity distribution of waveguided light propagating in parallel layer 4 and meandering layer 3 while shifting between parallel layer 4 and meandering layer 3 after incident light 5 is incident on diffraction grating layer 1. Part (e) of FIG. 6 is an explanatory view plotting total energy of light in an analysis region with respect to a propagation optical path length of waveguided light propagating in parallel layer 4 and meandering layer 3. In this case, the total energy of light is a sum total of energy of light (more specifically, a square of an electric field vector of light) in a total analysis region shown in FIG. 6 (inside a region surrounded by a rectangle in each of parts (b), (c), and (d) of FIG. 6). When oscillation of the light source is completed, the total energy of light in the total analysis region becomes maximum. Referring to parts (b) to (d) of FIG. 6, a black portion in each analysis region indicates a portion where light is present.

As shown in part (b) of FIG. 6, incident light 5 that has reached diffraction grating layer 1 is coupled to waveguided light, and propagates in meandering layer 3 near diffraction grating layer 1 and parallel layer 4 while repeatedly shifting between meandering layer 3 and parallel layer 4. Light that has not been coupled to diffraction grating layer 1 reaches a boundary on a lower side of a drawing plane of part (b) of FIG. 6 (negative z-axis direction side). Incident light 5 that has not been coupled to diffraction grating layer 1 exits outside from the analysis region. After part (b) of FIG. 6, because incident light 5 keeps leaking outside from the analysis region, the total energy of light keeps decreasing up to a propagation optical path length of 100 µm, but becomes stable in a range from a propagation optical path length 100 µm to a propagation optical path length of 500 µm. This is because, as shown in FIG. 5, waveguided light repeatedly shifts between meandering layer 3 and parallel layer 4 and remains inside meandering layer 3 and parallel layer 4. As shown in part (c) of FIG. 6, waveguided light repeatedly shifts between meandering layer 3 and parallel layer 4 and remains inside meandering layer 3 and parallel layer 4. Accordingly, because waveguide sheet 10 according to the first exemplary embodiment has the laminated structure having the plurality of meandering layers 3 and the plurality of parallel layers 4 alternately laminated on each other, it is possible to couple captured incident light 5 to waveguided light and confine the resultant light in waveguide sheet 10 for a certain period of time (distance).

Note that waveguided light that has propagated to an outer edge layer of the laminated structure is reflected by the outer edge layer and returns toward the central side on which diffraction grating layer 1 is located. Waveguided light propagating in the outer edge layer will be described later.

When waveguided light propagates in diffraction grating layer 1, the light is radiated from diffraction grating 19 almost vertically in a reverse process to light input coupling (capturing of incident light 5), and exits from the upper and lower sides of the drawing plane (z-axis direction) to outside of the analysis region. As shown in part (d) of FIG. 6, waveguided light that has propagated in diffraction grating layer 1 is radiated as radiation light in a vertical direction of the drawing plane (z-axis direction). This gradually attenuates the total energy of light at a propagation optical path length of 500 µm or more. That is, as shown in part (e) of FIG. 6, according to the analysis model shown in FIG. 6, although the total energy of light is attenuated near a propagation optical path length of 500 µm, increasing the numbers of meandering layers 3 and parallel layers 4 of the laminated structure having the plurality of meandering layers 3 and the plurality of parallel layers 4 alternately laminated on each other can increase the propagation optical path length at which the total energy of light is attenuated to 500 µm or more.

A change in shift efficiency of light with respect to an inclination of a propagation direction of waveguided light propagating in waveguide sheet 10 will be described next.

FIG. 7 is an explanatory view showing a simulation result on a change in inclination of a propagating direction of waveguided light and a change in shift efficiency of light. More specifically, part (a) of FIG. 7 is a schematic view showing a section taken along an xz plane of meandering layer 3 and parallel layer 4 complying with conditions A. A sectional structure of meandering layer 3 and parallel layer 4 shown in part (a) of FIG. 7 extends in a y-axis direction. Part (a) of FIG. 7 shows only one meandering layer 3 and one parallel layer 4. In an analysis shown in FIG. 7, all boundary conditions for an analysis region complied with perfectly matched layer (PML).

As shown in part (a) of FIG. 7, when waveguided light 6 in the TE mode is introduced from the upper end of the drawing plane (positive x-axis direction side) of parallel layer 4 with an inclination angle about a z-axis (an angle of waveguided light 6 propagating in parallel layer 4 with respect to an x-axis) as a parameter, part of waveguided light 6 shifts from parallel layer 4 to meandering layer 3 (waveguided light 6$i$). Waveguided light 6$h$ that has not shifted to meandering layer 3 propagates in parallel layer 4. A change in shift efficiency of light with respect to an incidence condition (inclination angle) for waveguided light 6 with respect to parallel layer 4 is read by virtually installing detectors $M_0$, $M_1$, $M_2$ and measuring amounts of waveguided light 6, waveguided light 6$h$, waveguided light 6$i$ before and after shifts of light.

Part (b) of FIG. 7 is an explanatory view showing an analysis result on a change in shift efficiency of light when a propagating direction of waveguided light is inclined about a z-axis in an xy plane. Note that a shift efficiency ($M_2/M_0$) shown in part (b) of FIG. 7 is a ratio of a light amount detected by detector $M_2$ to a light amount detected by detector $M_0$.

As shown in part (b) of FIG. 7, a shift efficiency decreases with an increase in inclination angle. The analysis result shown in part (b) of FIG. 7 indicates a qualitative trend because waveguided light 6 has a plurality of modes. This is because a coupling length formed between meandering layer 3 and parallel layer 4 changes depending on a propagating direction of waveguided light 6. Theoretically, assuming that a shift efficiency of light is 100% at an inclination angle of 0°, as the inclination angle becomes 60°, the coupling length doubles, and the shift efficiency of light becomes 0%. Referring to part (b) of FIG. 7, although the shift efficiency exceeds 1.0 when the inclination angle of incident waveguided light is in a range from 0° to near 10°, this is caused by a calculation error in numerical analysis. In actuality, the shift efficiency does not exceed 1.0.

Propagation of waveguided light near a boundary between laminated body 60$a$ and laminated body 60$b$ of waveguide sheet 10 will be described next. Part (a) of FIG. 8 is an explanatory view showing how waveguided light propagates in waveguide sheet 10 according to the first exemplary embodiment when parallel layer 4S is sandwiched between meandering layer 3 and meandering layer 3' having different meandering directions. An angular difference between the meandering directions of meandering layer 3 and meandering layer 3' (directions in which the meandering layers repeatedly come close to and separate from the adjacent parallel layers). More specifically, the meandering direction of meandering layer 3' is rotated by rotational angle φ about the z-axis with respect to the meandering direction of meandering layer 3

As shown in part (a) of FIG. 8, waveguided light propagating from meandering layer 3 shifts to parallel layer 4S to become waveguided light 7. Part of waveguided light 7 shifts to meandering layer 3' or parallel layer 4' to become waveguided light 7a or waveguided light 7b, and remaining part of waveguided light 7 remains in parallel layer 4S to become waveguided light 7A or waveguided light 7B.

In this case, nearby portion 3A where parallel layer 4S and meandering layer 3 come close to each other effectively increases in effective waveguide layer thickness, which differs in effective refractive index from remaining part in the layer. For example, a portion of meandering layer 3, other than nearby portion 3A, has an effective refractive index of 1.95, whereas nearby portion 3A has an effective refractive index of 2.05 (see P1 and P3 in part (d) of FIG. 18). Likewise, nearby portion 3A' where parallel layer 4S and meandering layer 3' come close to each other increases in effective layer thickness, and nearby portion 3A' between parallel layer 4S and meandering layer 3' differs in effective refractive index from a portion other than nearby portion 3A'.

Referring to part (a) of FIG. 8, nearby portion 3A is part of meandering layer 3 and parallel layer 4S located inside a region surrounded by broken lines, and nearby portion 3A' is part of meandering layer 3' and parallel layer 4S. In other words, nearby portion 3A includes meandering layer 3 and parallel layer 4S located inside the region surrounded by the broken lines, and nearby portion 3A' includes meandering layer 3' and parallel layer 4S located inside a region surrounded by broken lines.

Part (b) of FIG. 8 is an explanatory view showing an effective refractive index distribution seen from the positive z-axis direction side when a light shift phenomenon shown in part (a) of FIG. 8 is replaced with a two-dimensional model and waveguided light propagating in parallel layer 4S shifts to the negative z-axis direction side. A manner of how waveguided light propagates in parallel layer 4S, meandering layer 3', and parallel layer 4' will be described with reference to part (b) of FIG. 8. Part (c) of FIG. 8 is an explanatory view showing an effective refractive index distribution seen from the positive z-axis direction side when the light shift phenomenon shown in part (a) of FIG. 8 is replaced with a two-dimensional model and waveguided light propagating in parallel layer 4S shifts to the positive z-axis direction side. A manner of how waveguided light propagates in parallel layer 4S and meandering layer 3 will be described with reference to part (c) of FIG. 8. Note that an effective refractive index sensed by waveguided light is a high refractive index ($n_{eff}$=2.05) in nearby portion 3A and nearby portion 3A', but is a low refractive index ($n_{eff}$=1.95) in other portions. In addition, although part (b) of FIG. 8 and part (c) of FIG. 8 do not show sections of nearby portion 3A and nearby portion 3A', nearby portion 3A and nearby portion 3A' are indicated by hatching for the sake of description.

In the model shown in part (b) of FIG. 8, in a process in which waveguided light 7 shifts from parallel layer 4S to meandering layer 3', because an extending direction of nearby portion 3A' is inclined by the rotational angle φ with respect to an extending direction of nearby portion 3A, a refractive index difference (an effective refractive index difference sensed by waveguided light) is formed in a wedge shape. For this reason, waveguided light 7 is refracted and shifts from waveguided light 7a to waveguided light 7b. The propagating directions of waveguided light 7a and waveguided light 7b deviate from the xz plane and their meandering directions also deviate from meandering layer 3 and meandering layer 3', and hence a shift efficiency of light decreases.

In the model shown in part (c) of FIG. 8, in a process in which waveguided light 7 passes through nearby portion 3A' in parallel layer 4S, because the extending direction of nearby portion 3A' is inclined by the rotational angle φ with respect to an extending direction of nearby portion 3A, the refractive index difference formed in a wedge shape as described above causes waveguided light 7 to be refracted and shift from waveguided light 7A to waveguided light 7B. Waveguided light 7' incident on nearby portion 3A' is refracted in a direction opposite to waveguided light 7 and shifts to waveguided light 7A', waveguided light 7B'. Because propagating directions of waveguided light 7A, waveguided light 7A', waveguided light 7B, and waveguided light 7B' are inclined with respect to the xz plane, a shift efficiency of light decreases.

Part (a) of FIG. 9 is a schematic view showing an outermost surface structure of waveguide sheet 10 according to the first exemplary embodiment. Part (b) of FIG. 9 and part (c) of FIG. 9 are sectional views for explaining a relationship between curvature radii of meandering layers 3 and shifts of light.

As shown in part (b) of FIG. 9, effective coupling length W1 between meandering layer 3 and parallel layer 4 can be adjusted by optimizing curvature radius R1 at a position where meandering layer 3 is in contact with parallel layer 4. Theoretically, this makes it possible to cause waveguided light 8a propagating in meandering layer 3 to shift to waveguided light 8b propagating in parallel layer 4 at an efficiency of 100%. When parallel layer 4 is located at an outermost surface (a surface of waveguide sheet 10 which comes into contact with an external environment), waveguided light 8b propagating in parallel layer 4 on the outermost surface shifts to waveguided light 8d propagating in meandering layer 3 theoretically at an efficiency of 100%, and returns to inside of waveguide sheet 10. If, however, foreign substance 12 such as a water droplet adheres to a surface of parallel layer 4, waveguided light 8b is scattered by a portion to which foreign substance 12 adheres and is radiated outside parallel layer 4 (waveguide sheet 10).

Accordingly, as shown in parts (a) and (c) of FIG. 9, radiation of waveguided light to outside can be suppressed by forming light-transmissive pair 61a (fourth light-transmissive pair) located at an outermost layer of waveguide sheet 10 using meandering layer 3a (seventh light-transmissive layer) having curvature radius R2 larger than curvature radius R1 of meandering layer 3 and parallel layer 4a (eighth light-transmissive layer) located at the outermost surface. Meandering layer 3a has a shape with third concave streaks 74 and third convex streaks 75 being repeatedly formed. As shown in part (c) of FIG. 9, curvature radius R2 of each third concave streak 74 of meandering layer 3a is set to be larger than curvature radius R1 of first convex streak 71 of meandering layer 3. These curvature radii are preferably optimized. Parallel layer 4a is substantially identical to parallel layer 4.

Waveguided light 8b propagating in parallel layer 4 of light-transmissive pair 61 shifts to meandering layer 3a of light-transmissive pair 61a to become waveguided light 8B. In this case, because effective coupling length W2 between parallel layer 4 and meandering layer 3a is longer than coupling length W1 (more specifically, coupling length W2 is almost double coupling length W1), waveguided light 8B shifting to meandering layer 3a shifts to parallel layer 4 again to become waveguided light 8c. Optimizing curvature radius R2 of meandering layer 3a will make a shift efficiency of light from waveguided light 8b to waveguided light 8c become theoretically almost 100%. Waveguided light 8c that has returned to parallel layer 4 shifts to waveguided light 8d propagating in meandering layer 3 theoretically at a shift efficiency of 100%, and returns to inside of waveguide sheet 10. With this operation, even if foreign substance 12 such as a water droplet adheres to parallel layer 4a at the outermost surface, waveguided light 8B does not shift to parallel layer 4a and hence does not come into contact with foreign substance 12. This can suppress scattering of waveguided light 8B. Accordingly, forming the outermost layer of waveguide sheet 10 by using light-transmissive pair 61a shown in part (c) of FIG. 9 can suppress radiation of waveguided light to outside of waveguide sheet 10.

[Method of Manufacturing Waveguide Sheet]

A method of manufacturing waveguide sheet 10 according to the first exemplary embodiment will be described next.

FIG. 10 is a schematic view showing an example of a procedure for manufacturing waveguide sheet 10 according to the first exemplary embodiment. Referring to part (a) of FIG. 10, parallel layer 4 is an optical sheet made of acrylic with a thickness of about 0.5 µm. The 0.5 µm thick acrylic optical sheet has the same thickness as that of a resin base of a 240 min cassette recorder tape, and hence can be manufactured by using a rolling method conventionally used to manufacture the resin base. The acrylic optical sheet used for the formation of parallel layer 4 is irradiated with light by using a two-beam interference method, thereby manufacturing meandering layer 3. For example, a light source used in the two-beam interference method is a laser source (ultraviolet laser source) that emits ultraviolet light. Ultraviolet laser beams 14 (plane waves) emitted from two ultraviolet laser sources are made to intersect with each other such that optical axes of two ultraviolet laser beams 14 form a predetermined angle, thereby forming striped interference fringes 13 with a uniform pitch. Disposing the acrylic optical sheet used for formation of parallel layer 4 at positions where interference fringes 13 occur will cause cure shrinkage of the acrylic optical sheet at positions where light intensities are high. This forms an acrylic optical sheet as meandering layer 3 shown in part (b) of FIG. 10.

As shown in part (c) of FIG. 10, first meandering layer 3 is suspended and held in a noncontact state and moved onto first parallel layer 4 placed on a substrate.

As shown in part (d) of FIG. 10, different pressures are applied to upper and lower sides of first meandering layer 3, and is stacked on first parallel layer 4.

As shown in part (e) of FIG. 10, second parallel layer 4 is suspended and held in a noncontact state and moved onto first meandering layer 3.

As shown in part (f) of FIG. 10, different pressures are applied to upper and lower sides of second parallel layer 4, and second parallel layer 4 is stacked on first meandering layer 3.

As shown in part (g) of FIG. 10, second meandering layer 3 is suspended and held in a noncontact state and moved onto second parallel layer 4 such that meanderings of first and second meandering layers 3 synchronize with each other in the x-axis direction.

As shown in part (h) of FIG. 10, different pressures are applied to upper and lower sides of second meandering layer 3, and second meandering layer 3 is stacked on second parallel layer 4.

Repeating the above process will manufacture a laminated structure having meandering layers 3 and parallel layers 4 shown in FIG. 2 alternately laminated on each other. Note that in the process of alternately laminating parallel layers 4 and meandering layers 3, replacing parallel layer 4 with diffraction grating layer 1 midway along the process will manufacture laminated body 60a. In addition, laminated body 60a may be manufactured by manufacturing light-transmissive pairs 61 using meandering layers 3 and parallel layers 4 and laminating the plurality of light-transmissive pairs 61 on diffraction grating layer 1.

Waveguide sheet 10 is formed by laminating one or a plurality of laminated bodies 60a on one or a plurality of laminated bodies 60b upon being rotated from each other through a predetermined angle. In this case, a parallel layer located at a boundary between laminated body 60a and laminated body 60b is formed as common parallel layer 4S shared by laminated body 60a and laminated body 60b. Note that waveguide sheet 10 need not be formed by laminating a plurality of laminated bodies. That is, waveguide sheet 10 may be laminated body 60a.

Another method of manufacturing waveguide sheet 10 according to the first exemplary embodiment will be described next. FIG. 11 is a schematic view showing an example of another procedure for manufacturing waveguide sheet 10 according to the first exemplary embodiment.

As shown in part (a) of FIG. 11, fine projections (concave and convex streaks) are formed on one surface of thin flat plate 15 at a pitch of 0.2 µm or less by a nano-print technique, and an envelope of projection structure 15a is formed into a meandering shape along the x-axis. Flat plates 15 on which projection structures 15a are formed are stacked on each other such that meandering periods shift from each other by π.

As shown in part (b) of FIG. 11, the resultant structure is pressurized in the z-axis direction by press machine 17 so as to fill gaps. After pressing, flat plates 15 are deformed into meandering layers 3 and parallel layers 4 in conformity with a shape of a surface of press machine 17, and projection structures 15a are buried between meandering layers 3 and parallel layers 4.

As shown in part (c) of FIG. 11, fine projections (concave and convex streaks) may be formed on both surfaces of thin flat plate 16 at a pitch of 0.2 µm or less by the nano-print technique, and envelopes of projection structures 16a and 16b may be formed into meandering shapes along the x-axis. A meandering period on an obverse surface (for example, a surface located on the positive z-axis direction side) and a meandering period on a reverse surface (a surface located on the opposite side to the obverse surface) shift from each other by π. Flat plates 16, on each of which projection structure 16a and projection structure 16b are formed, and parallel layers 4 are alternately laminated on each other.

As shown in part (d) of FIG. 11, the resultant structure is pressurized in the z-axis direction by press machine 17 so as to fill gaps. After pressing, projection structures 16a and projection structures 16b are buried between meandering layers 3 and parallel layers 4.

If a pitch of projection structures 15a, 15b or a pitch of projection structures 16a, 16b is ⅓ or less a wavelength of waveguided light propagating in parallel layer 4 and meandering layer 3, no light diffraction occurs. Accordingly, the resultant structure acts as a medium with an effectively averaged refractive index. For this reason, projection structures 15a, 16a, 16b each function as transparent layer 2 shown in FIG. 1.

Note that flat plate 15 and flat plate 16 each undergo the above process and are formed into meandering layer 3. That is, a material used for flat plate 15 and flat plate 16 is the same as that for meandering layer 3. In addition, projection structures 15a, 16a, 16b each are processed to function as transparent layer 2 described above. Accordingly, a material used for projection structures 15a, 16a, 16b is the same as that for transparent layer 2 described above.

Laminated body 60a shown in FIG. 2 can be manufactured by laminating the laminated body including meandering layers 3, transparent layers 2, and parallel layers 4, manufactured by the above manufacturing process, on diffraction grating layer 1. Waveguide sheet 10 is formed by laminating one or a plurality of laminated bodies 60a on one or a plurality of laminated bodies 60b upon being rotated from each other through a predetermined angle.

Note that a thickness of meandering layer 3 and parallel layer 4 may be equal to or different from an effective thickness of diffraction grating layer 1, and the thickness of meandering layer 3 and parallel layer 4 and the effective thickness of diffraction grating layer 1 are not limited.

In addition, meandering layer 3, parallel layer 4, and diffraction grating layer 1 may be formed from different materials, respectively.

Grating conditions (diffraction grating pitch Λ and/or diffraction grating depth d and the like) for diffraction grating layer 1' of laminated body 60b may be the same as or different from grating conditions for diffraction grating layer 1 of laminated body 60a.

Film conditions (thickness t and/or material) for diffraction grating layer 1', meandering layer 3', and parallel layer 4' of laminated body 60b may be the same as or different from film conditions for laminated body 60a.

Waveguide sheet 10 may be manufactured by variously combining and stacking laminated bodies different in specifications (grating conditions and/or film conditions and the like) from laminated body 60a and laminated body 60b.

[Effects and the Like]

As described above, waveguide sheet 10 according to the first exemplary embodiment is configured to capture incident light and waveguide the incident light in a direction intersecting with the incident direction of the light. Waveguide sheet 10 includes diffraction grating layer 1 that changes the traveling direction of incident light. Waveguide sheet 10 also includes the first light-transmissive layer (meandering layer 3) laminated on diffraction grating layer 1 and having a shape with first concave streaks 70 and first convex streaks 71 being repeatedly formed in the first direction that is a direction intersecting with the incident direction and the second light-transmissive layer (parallel layer 4) laminated on meandering layer 3. Meandering layer 3 and parallel layer 4 laminated on each other constitute light-transmissive pair 61. Waveguide sheet 10 includes a plurality of light-transmissive pairs 61. The plurality of light-transmissive pairs 61 are laminated on each other such that adjacent first convex streaks 71 of meandering layer 3 are located on both sides of first concave streak 70 of next meandering layer 3 as seen in the incident direction.

With this structure, incident light 5 incident on waveguide sheet 10 is coupled to waveguided light 6 in diffraction grating layer 1, and is waveguided to meandering layer 3 and parallel layer 4. This allows waveguide sheet 10 to easily internally hold incident light 5 captured inside waveguide sheet 10 as waveguided light 6.

In addition, waveguide sheet 10 may have light-transmissive pairs 61 laminated on each other such that meandering layer 3 is disposed on a surface on the opposite side to a surface of diffraction grating layer 1 on which light-transmissive pairs 61 are laminated.

This allows waveguide sheet 10 to more easily internally hold incident light 5 captured inside waveguide sheet 10 as waveguided light 6.

Waveguide sheet 10 may also include first laminated body 60a having diffraction grating layer 1, meandering layers 3, and parallel layers 4 and configured to waveguide incident light in the first waveguiding direction as a direction intersecting with the incident direction and second laminated body 60b having a structure similar to that of first laminated body 60a. Second laminated body 60b may be laminated on first laminated body 60a so as to waveguide incident light in the second waveguiding direction different from the first waveguiding direction.

That is, waveguide sheet 10 can capture incident light 5 in a wide wavelength range and a wide angle range by including a plurality of diffraction grating layers with different diffraction grating conditions such as diffraction grating pitch Λ. This allows, if incident light 5 is sunlight, waveguide sheet 10 to capture sunlight through a wide area in a wide wavelength range and a wide angle range, effectively internally confine the captured light, and cause the light to exit from end face 102.

Photoelectric conversion device 100 includes waveguide sheet 10 and photoelectric conversion element 11 that has light-receiving surface 101 that receives light and converts the light received by light-receiving surface 101 into power. Light-transmissive pairs 61 are laminated on diffraction grating layer 1 in the light-receiving direction in which incident light incident on waveguide sheet 10 is received. Photoelectric conversion element 11 is disposed around waveguide sheet 10 such that light-receiving surface 101 is located to face end face 102 of waveguide sheet 10 located in a direction intersecting with the light-receiving direction.

This makes it possible for waveguide sheet 10 to effectively guide captured incident light 5 as waveguided light 6 to photoelectric conversion element 11. This allows photoelectric conversion device 100 to make photoelectric conversion element 11 receive a large amount of light as compared with a case in which photoelectric conversion element 11 directly receives incident light 5. That is, photoelectric conversion device 100 can generate a large amount of power even with a small area as compared with the case in which photoelectric conversion element 11 directly receives incident light 5. In other words, photoelectric conversion device 100 can capture incident light 5 from outside with a large area by using waveguide sheet 10 and efficiently guide captured incident light 5 to photoelectric conversion element 11. This makes it possible to efficiently photoelectrically convert incident light 5.

Second Exemplary Embodiment

A second exemplary embodiment will be described below with reference to FIG. 12 A waveguide sheet according to the second exemplary embodiment differs from waveguide sheet 10 according to the first exemplary embodiment in that laminated body 60c (third laminated body) is sandwiched between laminated body 60a and laminated body 60b. Note that in a description of the waveguide sheet according to the second exemplary embodiment, redundant description concerning substantially the same structures as those of waveguide sheet 10 according to the first exemplary embodiment are sometimes omitted or simplified.

[Structure of Waveguide Sheet]

FIG. 12 is a schematic sectional view showing the waveguide sheet according to the second exemplary embodiment.

As shown in FIG. 12, waveguide sheet 10a includes laminated body 60a, laminated body 60b, and laminated body 60c. Laminated body 60a and laminated body 60b are identical to laminated body 60a and laminated body 60b according to the first exemplary embodiment shown in FIG. 2. In the second exemplary embodiment, laminated body 60c is sandwiched between laminated body 60a and laminated body 60b.

Laminated body 60c is formed by alternately laminating meandering layers 3" and parallel layers 4", each pair of which sandwiches transparent layer 2". In a case shown in FIG. 12, a meandering direction of meandering layer 3" alternately rotates about a z-axis. Because meandering layer 3" rotates relative to meandering layer 3 and meandering layer 3', a waveguiding direction of waveguided light propagating from laminated body 60a or laminated body 60b to laminated body 60c differs from the meandering direction of meandering layer 3". This difference reduces shift efficiencies of waveguided light and light derived from the waveguided light, confines the light near laminated body 60c, and diffuses the light along an xy plane.

Note that at least one meandering layer 3" formed in laminated body 60c is preferably formed such that a meandering direction of meandering layer 3" differs from the meandering direction of meandering layer 3 or the meandering direction of meandering layer 3'.

For example, as shown in FIG. 12, laminated body 60c may include, as meandering layers 3", two types of meandering layers 31, 32 having different meandering directions, and meandering layers 31 and meandering layers 32 may be alternately laminated on each other with parallel layer 4" and transparent layer 2" interposed. In laminated body 60c, meandering layer 31 (third light-transmissive layer) and parallel layer 4" (fourth light-transmissive layer) constitute a light-transmissive pair (second light-transmissive pair), and meandering layer 32 (fifth light-transmissive layer) and parallel layer 4" (sixth light-transmissive layer) constitute a light-transmissive pair (third light-transmissive pair). In this case, a meandering direction (fourth direction) of meandering layer 31 may be substantially the same as or different from a meandering direction (third direction) of meandering layer 3 in laminated body 60b, and a meandering direction (fifth direction) of meandering layer 32 may be substantially the same as or different from a meandering direction (first direction) of meandering layer 3 in laminated body 60a.

As described above, in waveguide sheet 10a according to the second exemplary embodiment, a change in angle (meandering direction) of meandering layer 32 is highly diverse. This makes it possible to more improve a light confinement effect than waveguide sheet 10 according to the first exemplary embodiment by properly adjusting the change in angle. Accordingly, waveguide sheet 10a according to the second exemplary embodiment has a light confinement effect similar to that of waveguide sheet 10 according to the first exemplary embodiment.

In addition, photoelectric conversion device 100 may be manufactured by installing photoelectric conversion element 11 such as a solar cell on an end face of waveguide sheet 10a according to the second exemplary embodiment. Waveguide sheet 10a can more effectively guide captured incident light as waveguided light to photoelectric conversion element 11. This allows photoelectric conversion device 100 including waveguide sheet 10a to make photoelectric conversion element 11 receive more light as compared with, for example, a case in which photoelectric conversion element 11 directly receives incident light 5. That is, photoelectric conversion device 100 including waveguide sheet 10a can generate a large amount of power with a small area as compared with, for example, the case in which photoelectric conversion element 11 directly receives incident light 5.

Note that laminated body 60c may or may not have a diffraction grating layer on which a diffraction grating is formed and is not limited to any specific structure.

Third Exemplary Embodiment

A third exemplary embodiment will be described below with reference to FIGS. 13 and 14. A waveguide sheet according to the third exemplary embodiment differs from waveguide sheet 10 according to the first exemplary embodiment in a shape of a parallel layer (second light-transmissive layer). Note that in a description of the waveguide sheet according to the third exemplary embodiment, redundant description concerning substantially the same structures as those of waveguide sheet 10 according to the first exemplary embodiment are sometimes omitted or simplified.

[Structure of Waveguide Sheet]

FIG. 13 is an explanatory view showing how waveguided light is waveguided in a waveguide sheet according to the third exemplary embodiment.

As shown in FIG. 13, meandering layer 40 (second light-transmissive layer) that is not perfectly flat unlike parallel layer 4 and gradually meanders in a y-axis direction (meandering pitch Py) is laminated on an upper surface of meandering layer 3 unlike waveguide sheet 10 according to the first exemplary embodiment. That is, meandering layer 40 has a shape with second concave streaks 73 and second convex streaks 72 being repeatedly formed in a second direction (a y-axis direction in FIG. 13) that is a direction intersecting with an incident direction of incident light externally incident on waveguide sheet 10b.

Although not shown, like laminated body 60a shown in FIG. 2, waveguide sheet 10b includes diffraction grating layer 1 and laminated structures, each having a plurality of meandering layers 3 and a plurality of meandering layers 40 alternately laminated on each other, on an upper surface side and a lower surface side of diffraction grating layer 1. As a result, gaps between meandering layer 40 and meandering layer 3 vary from gap s to gap s'. A total amplitude of meandering of meandering layer 40 is s'-s. Waveguided light 9 propagating in meandering layer 40 in an x-axis direction shifts to meandering layer 3 to become waveguided light 9a.

Consider a case in which gap s between meandering layer 40 and meandering layer 3 is adjusted to theoretically achieve a shift efficiency of 100% (an optical value). In this case, waveguided light 9' propagating along the x-axis direction at different y-coordinates shifts to meandering layer 3 to become waveguided light 9a'. In addition, because gas s' is different from gap s that is an optical value for making light shift from meandering layer 40 to meandering layer 3, a shift efficiency of light decreases. Consequently, part of waveguided light 9' does not shift and remains in meandering layer 40 to become waveguided light 9b'.

Nearby portion 3B where meandering layer 40 and meandering layer 3 come close to each other increases in effective layer thickness, which differs in effective refractive index from remaining part in the layer. For example, portions in the layers, other than nearby portion 3B, have an effective refractive index of 1.95, whereas nearby portion 3B has an effective refractive index of 2.05 (see P1 and P3 in part (d) of FIG. 18).

Note that as a gap between meandering layer 40 and meandering layer 3 increases, an effective layer thickness decreases.

FIG. 14 shows an analysis result obtained by analyzing a shift phenomenon of light in waveguide sheet 10b having a structure shown in FIG. 13 by using a two-dimensional model (xy section). More specifically, part (a) of FIG. 14 is an explanatory view showing a refractive index distribution chart used in a simulation using a two-dimensional model concerning a shift phenomenon of light in waveguide sheet 10b according to the third exemplary embodiment. Part (b) of FIG. 14 is an explanatory graph showing propagation optical path length dependence of a Poynting vector intensity ratio as a simulation result using a two-dimensional model showing a shift phenomenon of light shown in part (a) of FIG. 14.

Referring to part (a) of FIG. 14, regions indicated by hatching such as nearby portions 3B1, 3B2, 3B3, 3B4 are regions (regions where meandering layer 40 and meandering layer 3 come close to each other) in which meandering phases are randomly disposed in a y-axis direction shown in FIG. 13 and which have an effective refractive index of 2.05. Referring to part (a) of FIG. 14, other portions that are not indicated by hatching are regions 50 having an effective refractive index of 1.95. Referring to part (a) of FIG. 14, boundary conditions for upper, lower, right, and left sides of an analysis region complied with PBC, and an analysis width in the y-axis direction was set to 30 µm. Waveguided light 9 introduced into an analysis region was S-polarized light with a width (spot diameter) of 30 µm and a wavelength of 0.85 µm, and coherence length L corresponded to 20 µm pulse light. In addition, a total meandering amplitude (s'-s) of meandering layer 40 was set to 0.1 µm.

As shown in part (b) of FIG. 14, an intensity ratio (Qy/(Qx+Qy)) of Poynting vector Qy in the y-axis direction increases with an increase in propagation length. Note that Poynting vector Qy is Poynting vector in the y-axis direction, and Poynting vector Qx is a Poynting vector in the x-axis direction.

Waveguided light propagating in the analysis region shown in part (a) of FIG. 14 is diffused in an xy plane. As the waveguided light is diffused in the xy plane, a waveguiding direction of the waveguided light differs from a meandering direction of meandering layer 3. This reduces the shift efficiency of the waveguided light and makes it difficult for the waveguided light to shift from the layer in which the light is propagating to a nearby layer. That is, the waveguided light tends to be confined in waveguide sheet 10b.

Although a meandering shape of meandering layer 40 in the y-axis direction may be formed in conformity with a design, such meandering shape sometimes naturally appears in a manufacturing method shown in FIGS. 10 and 11. This meandering shape gradually changes the propagating direction of the waveguided light propagating away from diffraction grating layer 1 while repeatedly shifting from diffraction grating layer 1 on which diffraction gratings 19 are formed to meandering layer 40 or meandering layer 3. This gradually makes it difficult for the waveguided light to shift to another layer at a position away from diffraction grating layer 1. Accordingly, the waveguided light is diffused along the xy plane while being confined in the layer in which the light is propagating. Therefore, waveguide sheet 10b according to the third exemplary embodiment has the same light confinement effect as that of waveguide sheet 10 according to the first exemplary embodiment.

Although meandering layer 40 is shaped to meander along the y-axis direction in the third exemplary embodiment, meandering layer 3 may be shaped to further meander along the y-axis direction. That is, meandering layer 40 (second light-transmissive layer) and meandering layer 3 (first light-transmissive layer) may have such meandering shapes as to repeatedly come close and separate in a direction intersecting with the meandering direction (x-axis direction) of meandering layer 3.

[Effects and the Like]

As described above, the second light-transmissive layer (meandering layer 40) of waveguide sheet 10b has a shape with second concave streaks 73 and second convex streaks 72 being repeatedly formed in the second direction as a direction intersecting with the incident direction.

This makes it easy for waveguide sheet 10b to internally hold incident light captured in waveguide sheet 10b as waveguided light. In addition, waveguided light waveguided in waveguide sheet 10b is efficiently made to exit from an end face of waveguide sheet 10b. This allows photoelectric conversion device 100 using waveguide sheet 10b to efficiently supply light to photoelectric conversion element 11 disposed around waveguide sheet 10b.

Fourth Exemplary Embodiment

A fourth exemplary embodiment will be described below with reference to FIG. 15. A waveguide sheet according to the fourth exemplary embodiment differs in a shape of a parallel layer from waveguide sheet 10 according to the first exemplary embodiment. Note that in a description of the waveguide sheet according to the third exemplary embodiment, redundant description concerning substantially the same structures as those of waveguide sheet 10 according to the first exemplary embodiment are sometimes omitted or simplified.

[Structure of Waveguide Sheet]

FIG. 15 is a schematic view showing the waveguide sheet according to the fourth exemplary embodiment. Unlike waveguide sheet 10 according to the first exemplary embodiment, waveguide sheet 10c includes meandering layer 41 that is not a flat surface instead of parallel layer 4. Meandering layer 41 has the same shape as that of meandering layer 3. That is, waveguide sheet 10c includes diffraction grating layer 1, meandering layers 3, and meandering layers 41 (second light-transmissive layers). Although not shown, like laminated body 60a shown in FIG. 2, waveguide sheet 10c has a structure having a plurality of meandering layers 3 and a plurality of meandering layers 41 alternately laminated on an upper surface side and a lower surface side of diffraction grating layer 1.

In this case, a meandering phase (period) of meandering layer 41 is shifted in the x-axis direction by ½ period in a meandering direction with respect to meandering layer 3. This causes meandering layer 3 and meandering layer 41 to periodically come close to and separate from each other, and hence waveguide sheet 10c has the same light confinement effect as that of waveguide sheet 10 according to the first exemplary embodiment, in which meandering layer 3 and parallel layer 4 periodically come close to and separate from each other. In addition, because waveguide sheet 10c requires no parallel layer 4, the number of types of layer structures can be reduced. Accordingly, waveguide sheet 10c can be manufactured more easily than waveguide sheet 10 according to the first exemplary embodiment.

Fifth Exemplary Embodiment

A fifth exemplary embodiment will be described below with reference to FIGS. 16 and 17.

A waveguide sheet according to the fifth exemplary embodiment differs from waveguide sheet 10 according to the first exemplary embodiment in that diffraction gratings for changing a waveguiding direction of waveguided light to a desired direction are formed on part of a parallel layer and/or meandering layer. Note that in a description of the waveguide sheet according to the fifth exemplary embodiment, redundant description concerning substantially the same structures as those of waveguide sheet 10 according to the first exemplary embodiment are sometimes omitted or simplified.

[Structure of Waveguide Sheet]

FIG. 16 is a schematic view showing waveguide sheet 10d according to the fifth exemplary embodiment. Waveguide sheet 10d includes diffraction grating layer 1, meandering layers 3, and parallel layers 42. Although not shown, like laminated body 60a shown in FIG. 2, waveguide sheet 10d has a structure having a plurality of meandering layers 3 and a plurality of parallel layers 42 alternately laminated on each other on an upper surface side and a lower surface side of diffraction grating layer 1. In this case, as shown in FIG. 16, diffraction gratings 18 are formed on part of parallel layer 42 according to the fifth exemplary embodiment.

Waveguided light to which incident light incident on diffraction grating layer 1 is coupled repeatedly shifts between meandering layer 3 and parallel layer 42 and propagates away from diffraction grating layer 1 toward a laminating direction side while propagating in a positive x-axis direction. Waveguided light 7 that has reached parallel layer 42 on which diffraction grating 18 is formed is incident on diffraction grating 18 formed on parallel layer 42. At this time, a waveguiding direction of waveguided light 7 that has propagated in the positive x-axis direction is bent by diffraction grating 18 in a y-axis direction to become waveguided light 7L. Likewise, the waveguiding direction of waveguided light 7' propagating in meandering layer 3 in an x-axis direction is also bent in the y-axis direction to become waveguided light 7L'.

Note that diffraction grating 18 may be dispersively formed at positions where parallel layer 42 and meandering layer 3 come close to each other, or formed independently on parallel layer 42 and meandering layer 3.

FIG. 17 is an explanatory view showing how the propagating direction of waveguided light shown in FIG. 16 changes. Note that FIG. 17 is a bottom view showing parallel layer 42 on which diffraction grating 18 is formed when viewed from a lower surface side.

As shown in FIG. 17, for example, diffraction grating 18 is formed such that a grating vector and the y-axis direction form an angle ($ß+π/2$). Diffraction grating pitch Λ of diffraction grating 18 is 0.32 μm. An outer shape of diffraction grating 18 is formed with diffraction grating width Wa along a direction at angle α with respect to the y-axis direction. An effective refractive index of parallel layer 42 was set to 1.90, and an effective refractive index of a portion where diffraction grating 18 was formed was set to a combination of 1.90 and 1.45.

As a result of an analysis on a waveguiding direction of waveguided light under the above conditions for diffraction grating 18, waveguided light 7 was diffracted vertically on a positive y-axis direction side (waveguided light 7L) and a diffraction efficiency was 81% when angle α=35° and angle ß=45°. That is, forming diffraction grating 18 on parallel layer 42 can efficiently make a propagating direction of waveguided light different from a meandering direction of meandering layer 3 and confine the waveguided light near a layer on which diffraction grating 18 is formed. Accordingly, waveguide sheet 10d according to the fifth exemplary embodiment has the same light confinement effect as that of waveguide sheet 10 according to the first exemplary embodiment.

Note that the above shape of diffraction grating 18 is an example, and a length of diffraction grating pitch Λ and an outer shape of diffraction grating 18 are not limited.

Diffraction grating 18 may be formed on meandering layer 3 instead of parallel layer 42. Diffraction gratings 18 may be respectively formed on parallel layer 42 and meandering layer 3. That is, diffraction grating 18 may be formed on part of a surface of at least one of parallel layer 42 (second light-transmissive layer) and meandering layer 3 (first light-transmissive layer). Note that diffraction grating 18 may be formed on at least one of meandering layer 40 and meandering layer 3 of waveguide sheet 10b according to the third exemplary embodiment or on at least one of meandering layer 41 and meandering layer 3 of waveguide sheet 10c according to the fourth exemplary embodiment.

[Effects and the Like]

As described above, waveguide sheet 10d has diffraction grating 18 formed on at least one of the first light-transmissive layer (meandering layer 3) and the second light-transmissive layer (parallel layer 42).

This allows waveguide sheet 10d to easily internally hold incident light captured in waveguide sheet 10d as waveguided light. In addition, waveguided light waveguided in waveguide sheet 10d is efficiently made to exit from an end face of waveguide sheet 10d. This allows photoelectric conversion device 100 using waveguide sheet 10d to efficiently supply light to photoelectric conversion element 11 disposed around waveguide sheet 10d.

Other Exemplary Embodiments

The first, second, third, fourth, and fifth exemplary embodiments have been described above as an example of the technique disclosed in the present application. However, the technique of the present disclosure is not limited to these exemplary embodiments, and also applicable to other exemplary embodiments that undergo some modifications, replacements, additions, and omissions, for example, as appropriate. In addition, new exemplary embodiments can be made by combining constituent elements described in the first, second, third, fourth, and fifth exemplary embodiments. Some other exemplary embodiments will be described below as examples.

For example, in the above exemplary embodiments, diffraction gratings have been described as concave and convex portions on surfaces of waveguide layers (diffraction grating layers, meandering layers, and parallel layers). However, diffraction gratings are not limited to them. For example, a diffraction grating may be a periodic structure with refractive index differences formed inside the waveguide layer.

An arrangement obtained by appropriately combining the above exemplary embodiments may be conceivable. Assume that a photoelectric conversion device has a light confinement effect similar to that of the first exemplary embodiment, has a photoelectric conversion element such as a solar cell installed on a waveguide sheet end face, and receives captured light. In this case, a reduction in cost of the photoelectric conversion device can be achieved by reducing a thickness of the sheet even with a great reduction in area of the photoelectric conversion element.

The exemplary embodiments have been described above as examples of the technique in the present disclosure. For this purpose, the accompanying drawings and the detailed description have been provided.

Therefore, in order to illustrate the above techniques, the components described in the accompanying drawings and the detailed description can include not only components necessary to solve the problem but also components not necessary to solve the problem. Therefore, the components that are not essential should not be immediately recognized as being essential on the basis of the illustration of the components, which are not essential, in the accompanying drawings and the detailed description.

Since the above described exemplary embodiments are intended to exemplify the technique according to the present disclosure, various modifications, replacements, additions, and omissions can be made within the scope of the appended claims or of their equivalents.

INDUSTRIAL APPLICABILITY

The waveguide sheet according to the present disclosure is useful as an optical sheet that can capture light with a large area. In addition, the photoelectric conversion device using the waveguide sheet according to the present disclosure can capture sunlight over a wide wavelength range (for example, an entire visible light region) with, for example, a large area, and hence is useful for a solar power generation device.

What is claimed is:

1. A waveguide sheet that captures incident light and waveguides the incident light in a direction intersecting with an incident direction of the incident light, the waveguide sheet comprising:
    a diffraction grating layer that changes a traveling direction of the incident light; and
    a plurality of first light-transmissive pairs each including
        a first light-transmissive layer having a shape with first concave streaks and first convex streaks being repeatedly arranged in a first direction that is a direction intersecting with the incident direction and
        a second light-transmissive layer laminated on the first light-transmissive layer, wherein
    in the plurality of first light-transmissive pairs,
    the first light-transmissive layer is located closer to a side of the diffraction grating layer than the second light-transmissive layer and
    each of the first concave streaks of another first light-transmissive layer adjacent to the first light-transmissive layer is located between adjacent first convex streaks among the first convex streaks of the first light-transmissive layer as seen in the incident direction.

2. The waveguide sheet according to claim 1, wherein the plurality of first light-transmissive pairs are disposed on both surfaces of the diffraction grating layer.

3. The waveguide sheet according to claim 1, wherein the second light-transmissive layer has a shape with second concave streaks and second convex streaks being repeatedly arranged in a second direction that is a direction intersecting with the incident direction.

4. The waveguide sheet according to claim 1, wherein the second light-transmissive layer has a shape with first concave streaks and first convex streaks being repeatedly arranged in the first direction.

5. The waveguide sheet according to claim 1, wherein a diffraction grating is disposed on at least one of the first light-transmissive layer and the second light-transmissive layer.

6. The waveguide sheet according to claim 1, further comprising:
    a first laminated body including the diffraction grating layer, the first light-transmissive layer, and the second light-transmissive layer; and
    a second laminated body having a structure identical to a structure of the first laminated body,
    wherein the second laminated body is laminated on the first laminated body, a direction in which the first concave streaks and the first convex streaks are repeatedly arranged on the first light-transmissive layer of the second laminated body being a third direction different from the first direction in the first laminated body.

7. The waveguide sheet according to claim 6, further comprising a third laminated body that is disposed between the first laminated body and the second laminated body, and has a second light-transmissive pair and a third light-transmissive pair alternately laminated on each other,
    wherein
    the second light-transmissive pair includes a third light-transmissive layer having a shape with the first concave streaks and the first convex streaks being repeatedly arranged and a fourth light-transmissive layer laminated on the third light-transmissive layer,
    the third light-transmissive pair includes a fifth light-transmissive layer having a shape with the first concave streaks and the first convex streaks being repeatedly arranged and a sixth light-transmissive layer laminated on the fifth light-transmissive layer, and
    a direction in which the first concave streaks and the first convex streaks are repeatedly arranged on the third light-transmissive layer is a fourth direction different from the first direction, and a direction in which the first concave streaks and the first convex streaks are repeatedly arranged on the fifth light-transmissive layer is a fifth direction different from the third direction and the fourth direction.

8. The waveguide sheet according to claim 1, further comprising a fourth light-transmissive pair including, a seventh light-transmissive layer having a shape with third concave streaks and third convex streaks being repeatedly arranged, and an eighth light-transmissive layer laminated on the seventh light-transmissive layer,
    wherein
    the eighth light-transmissive layer of the fourth light-transmissive pair is located at an outermost surface of the waveguide sheet, and
    each curvature radius of the third concave streaks is larger than each curvature radius of the first convex streaks.

9. A photoelectric conversion device comprising:
    a waveguide sheet defined in claim 1; and
    a photoelectric conversion element that has a light-receiving surface that receives light and converts light received by the light-receiving surface into power,
    wherein the photoelectric conversion element is disposed around the waveguide sheet, the light-receiving surface being located to face an end face of the waveguide sheet located in a direction intersecting with the incident direction.

10. The waveguide sheet according to claim 2, wherein the second light-transmissive layer has a shape with second concave streaks and second convex streaks being repeatedly arranged in a second direction that is a direction intersecting with the incident direction.

11. The waveguide sheet according to claim 2, wherein the second light-transmissive layer has a shape with first concave streaks and first convex streaks being repeatedly arranged in the first direction.

12. The waveguide sheet according to claim 2, wherein a diffraction grating is disposed on at least one of the first light-transmissive layer and the second light-transmissive layer.

13. The waveguide sheet according to claim 3, wherein a diffraction grating is disposed on at least one of the first light-transmissive layer and the second light-transmissive layer.

14. The waveguide sheet according to claim 4, wherein a diffraction grating is disposed on at least one of the first light-transmissive layer and the second light-transmissive layer.

15. The waveguide sheet according to claim 10, wherein a diffraction grating is disposed on at least one of the first light-transmissive layer and the second light-transmissive layer.

16. The waveguide sheet according to claim 11, wherein a diffraction grating is disposed on at least one of the first light-transmissive layer and the second light-transmissive layer.

17. The waveguide sheet according to claim 2, further comprising:
   a first laminated body including the diffraction grating layer, the first light-transmissive layer, and the second light-transmissive layer; and
   a second laminated body having a structure identical to a structure of the first laminated body,
   wherein the second laminated body is laminated on the first laminated body, a direction in which the first concave streaks and the first convex streaks are repeatedly arranged on the first light-transmissive layer of the second laminated body being a third direction different from the first direction in the first laminated body.

18. The waveguide sheet according to claim 3, further comprising:
   a first laminated body including the diffraction grating layer, the first light-transmissive layer, and the second light-transmissive layer; and
   a second laminated body having a structure identical to a structure of the first laminated body,
   wherein the second laminated body is laminated on the first laminated body, a direction in which the first concave streaks and the first convex streaks are repeatedly arranged on the first light-transmissive layer of the second laminated body being a third direction different from the first direction in the first laminated body.

19. The waveguide sheet according to claim 4, further comprising:
   a first laminated body including the diffraction grating layer, the first light-transmissive layer, and the second light-transmissive layer; and
   a second laminated body having a structure identical to a structure of the first laminated body,
   wherein the second laminated body is laminated on the first laminated body, a direction in which the first concave streaks and the first convex streaks are repeatedly arranged on the first light-transmissive layer of the second laminated body being a third direction different from the first direction in the first laminated body.

20. The waveguide sheet according to claim 5, further comprising:
   a first laminated body including the diffraction grating layer, the first light-transmissive layer, and the second light-transmissive layer; and
   a second laminated body having a structure identical to a structure of the first laminated body,
   wherein the second laminated body is laminated on the first laminated body, a direction in which the first concave streaks and the first convex streaks are repeatedly arranged on the first light-transmissive layer of the second laminated body being a third direction different from the first direction in the first laminated body.

* * * * *